US012674094B2

(12) United States Patent
Jo et al.

(10) Patent No.: US 12,674,094 B2
(45) Date of Patent: Jul. 7, 2026

(54) SEMICONDUCTOR NANOPARTICLE, AND COLOR CONVERSION PANEL AND ELECTRONIC DEVICE INCLUDING THE SAME

(71) Applicant: SAMSUNG ELECTRONICS CO., LTD., Suwon-si (KR)

(72) Inventors: A Ra Jo, Suwon-si (KR); Nayoun Won, Suwon-si (KR); Yebin Jung, Suwon-si (KR); Minho Kim, Suwon-si (KR); Tae-Gon Kim, Suwon-si (KR); Seungrim Yang, Suwon-si (KR); Shin Ae Jun, Suwon-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 475 days.

(21) Appl. No.: 18/185,810

(22) Filed: Mar. 17, 2023

(65) Prior Publication Data

US 2023/0295491 A1 Sep. 21, 2023

(30) Foreign Application Priority Data

Mar. 18, 2022 (KR) ........................ 10-2022-0034341

(51) Int. Cl.
*C09K 11/62* (2006.01)
*B82Y 20/00* (2011.01)
(Continued)

(52) U.S. Cl.
CPC ............ *C09K 11/621* (2013.01); *C09K 11/02* (2013.01); *H10H 20/8512* (2025.01); *B82Y 20/00* (2013.01); *B82Y 40/00* (2013.01)

(58) Field of Classification Search
None
See application file for complete search history.

(56) References Cited

U.S. PATENT DOCUMENTS 10,927,294 B2    2/2021   Mamuye et al.
11,101,413 B2    8/2021   Torimoto et al.
(Continued)

FOREIGN PATENT DOCUMENTS

CN         113275022 A     8/2021
JP       2019085575 A     6/2019
(Continued)

OTHER PUBLICATIONS

KR 20140074128 A Translation (Year: 2014).*
(Continued)

*Primary Examiner* — Yara B Green
*Assistant Examiner* — Coralie A Nettles
(74) *Attorney, Agent, or Firm* — CANTOR COLBURN LLP

(57) ABSTRACT

A semiconductor nanoparticle, and a method for producing the semiconductor nanoparticle, and a composite, a color conversion panel, and a display panel including the semiconductor nanoparticle. The semiconductor nanoparticle includes silver, a Group 13 metal including indium and gallium, and a chalcogen element including sulfur and optionally selenium, the semiconductor nanoparticle is configured to emit a green light with an emission peak wavelength of 500 nanometers to 580 nanometers, and a full width at half maximum of about 5 nm to about 70 nm. The semiconductor nanoparticle exhibits a quantum yield of greater than or equal to about 50%, and includes a mole ratio (In+Ga):Ag of about 1:1 to about 3.5:1.

20 Claims, 13 Drawing Sheets

(51) Int. Cl.
  *B82Y 40/00*    (2011.01)
  *C09K 11/02*    (2006.01)
  *H10H 20/851*   (2025.01)

(56)    References Cited

U.S. PATENT DOCUMENTS

| | | | |
|---|---|---|---|
| 11,957,020 | B2 | 4/2024 | Ichihashi et al. |
| 2017/0267924 | A1 | 9/2017 | Kuwabata et al. |
| 2020/0006601 | A1 | 1/2020 | Torimoto et al. |
| 2020/0024713 | A1 | 1/2020 | Das et al. |
| 2020/0172806 | A1 | 6/2020 | Park et al. |
| 2020/0399535 | A1 | 12/2020 | Mamuye et al. |
| 2021/0284908 | A1 | 9/2021 | Kim et al. |
| 2021/0363422 | A1 | 11/2021 | Nikata et al. |
| 2022/0228057 | A1 | 7/2022 | Mamuye et al. |
| 2023/0102912 | A1* | 3/2023 | Wu .................... H10H 20/8514 |
| | | | 257/79 |
| 2023/0151271 | A1* | 5/2023 | Torimoto ............... C09K 11/56 |
| | | | 252/301.4 S |
| 2023/0165026 | A1* | 5/2023 | Torimoto ............... B82Y 40/00 |
| | | | 252/301.36 |

FOREIGN PATENT DOCUMENTS

| | | | | | |
|---|---|---|---|---|---|
| KR | 20140074128 | A | * | 6/2014 | ............ C09K 11/62 |
| KR | 101734464 | B1 | | 5/2017 | |
| KR | 101904968 | B1 | | 10/2018 | |
| KR | 2047116 | B1 | | 11/2019 | |
| KR | 20200109307 | A | | 9/2020 | |
| KR | 20200120532 | A | | 10/2020 | |
| KR | 20210007738 | A | | 1/2021 | |
| KR | 20210027276 | A | | 3/2021 | |
| KR | 20210036978 | A | | 4/2021 | |
| KR | 20210115612 | A | | 9/2021 | |
| WO | 2021182417 | A1 | | 9/2021 | |

OTHER PUBLICATIONS

Cheng Ruan, et al., White Light-Emitting Diodes Based on AgInS2/ZnS Quantum Dots with Improved Bandwidth in Visible Light Communication, Nanomaterials, 2016, 6, 13; doi:10.3390/nano6010013, 8 pp.

Irshad Ahmad Mir, et al., Bandgap tunable AgInS based quantum dots for high contrast cell imaging with enhanced photodynamic and antifungal applications, 2018, Scientific Reports, 8(1), pp. 1-12.

Taro Uematsu, et al., Narrow band-edge photoluminescence from AgInS2 semiconductor nanoparticles by the formation of amorphous III-VI semiconductor shells, NPG Asia Materials (2018) 10: 713-726.

Tatsuya Kameyama, et al., Wavelength-Tunable Band-Edge Photoluminescence of Nonstoichiometric Ag—In—S Nanoparticles via Ga 3+ Doping, ACS Applied Materials & Interfaces, 10(49), 2018, pp. 42844-42855.

Watcharaporn Hoisang, et al., Core Nanoparticle Engineering for Narrower andMore Intense Band-Edge Emission from AgInS2/GaSxCore/Shell Quantum Dots, Nanomaterials 2019, 9, 1763, 16 pp.

Extended European Search Report dated Jul. 20, 2023, of the corresponding European Patent Application No. 23162742.3.

Office Action dated Aug. 30, 2024, of the corresponding Korean Patent Application No. 10-2023-0035485.

\* cited by examiner

Pattern Preparation by using a photoresist

Repeating three times of patterning process for each pixel

SEMICONDUCTOR NANOPARTICLE, AND COLOR CONVERSION PANEL AND ELECTRONIC DEVICE INCLUDING THE SAME

CROSS-REFERENCE TO RELATED APPLICATION

This application claims priority to Korean Patent Application No. 10-2022-0034341 filed in the Korean Intellectual Property Office on Mar. 18, 2022, and all the benefits accruing therefrom under 35 U.S.C. § 119, the entire content of which is incorporated herein by reference.

BACKGROUND

1. Field

A semiconductor nanoparticle, a method of producing the semiconductor nanoparticle, and a color conversion panel and an electronic device including the semiconductor nanoparticle.

2. Description of the Related Art

A semiconductor nanoparticle may exhibit different aspects, characteristics, or properties than a corresponding bulk material having substantially the same composition. For example, a semiconductor nanoparticle may have in terms of some of the physical properties of the nanostructure (e.g., a bandgap energy, a luminescent property, and the like), which are intrinsic to the bulk material. A semiconductor nanoparticle may be structured to emit light of a desired wavelength region by controlling the size and/or composition. Light emission from the semiconductor nanoparticle may be generated when electrons in an excited state transit from a conduction band to a valence band, for example, by an energy such as an incident light or an applied voltage. Accordingly, a luminescent semiconductor nanoparticle may find applicability in a variety of devices (e.g., an electronic device such as a display device).

SUMMARY

An embodiment relates to a semiconductor nanoparticle capable of emitting light and exhibiting an improved optical property (e.g., relatively high excitation light absorbance or a narrow full width at half maximum) and/or an improved stability (for example, process stability or chemical stability). An embodiment also relates to a device (such as a color conversion panel) including the semiconductor nanoparticle.

An embodiment relates to a method of producing the semiconductor nanoparticle.

An embodiment relates to a composition (e.g., an ink composition) including the semiconductor nanoparticle.

An embodiment relates to an electronic device (e.g., a display device) including the semiconductor nanoparticle or the device (e.g., the color conversion panel) of the embodiment.

In an embodiment, semiconductor nanoparticles include silver, a Group 13 metal including indium and gallium, and a chalcogen element including sulfur, and optionally selenium, wherein the semiconductor nanoparticles are configured to emit a green light having an emission peak wavelength of greater than or equal to about 500 nanometers (nm) and less than or equal to about 580 nm, wherein the green light exhibits a full width at half maximum of greater than or equal to about 5 nm and less than or equal to about 70 nm, wherein the semiconductor nanoparticles are configured to exhibit a quantum yield (e.g., an absolute quantum yield, hereinafter, "quantum yield") of greater than or equal to about 50%, wherein in the semiconductor nanoparticles, a mole ratio of a sum of indium and gallium to silver ((In+Ga):Ag) of greater than or equal to about 1:1 and less than or equal to about 3.5:1.

In the semiconductor nanoparticles a mole ratio of gallium to sulfur (Ga:S) is greater than or equal to about 0.3:1 and less than or equal to about 1:1.

The semiconductor nanoparticles may have a core-shell structure including a core and a shell disposed on the core. In the semiconductor nanoparticles, an amount of gallium is greater in the shell than in the core. The core may include (a Group 11-13-16 compound including silver, indium, and sulfur. The core may include a first semiconductor nanocrystal (for example, including the Group 11-13-16 compound). The shell may include a second semiconductor nanocrystal disposed on the first semiconductor nanocrystal, that is, the core, or surrounding at least a portion of the first semiconductor nanocrystal.

The first semiconductor nanocrystal or the core may include silver, indium, and sulfur.

The second semiconductor nanocrystals may include gallium, sulfur, and optionally silver. The second semiconductor nanocrystal may have a different composition from the first semiconductor nanocrystal. The first semiconductor nanocrystal or the core may include or may not include gallium. The first semiconductor nanocrystal may include or may not include zinc. The first semiconductor nanocrystal may include or may not include selenium.

The emission peak wavelength of the green light may be greater than or equal to about 505 nm and less than or equal to about 580 nm, or about 510 nm and less than or equal to about 550 nm.

The semiconductor nanoparticles may exhibit a quantum yield of greater than or equal to about 60%. The quantum yield may be greater than or equal to about 62%, greater than or equal to about 65%, or greater than or equal to about 70%. The quantum yield may be from about 80% to 100%.

The full width at half maximum may be less than or equal to about 55 nm, less than or equal to about 53 nm, less than or equal to about 45 nm, less than or equal to about 40 nm, or less than or equal to about 35 nm. The full width at half maximum may be greater than or equal to about 5 nm, greater than or equal to about 10 nm, greater than or equal to about 15 nm, or greater than or equal to about 25 nm.

The green light may include a band-edge emission. At least about 90%, at least about 95%, or at least about 97% of emission of the nanoparticles may be band-edge emission.

In a photoluminescence spectrum of the semiconductor nanoparticles, a relative band-edge emission intensity as defined by the following equation may be greater than about 20:

relative band-edge emission intensity=A1/A2 wherein, A1 is an intensity of the spectrum at an emission peak wavelength, and

A2 is a maximum intensity of the spectrum in a tail wavelength range of the emission peak wavelength plus greater than or equal to about 80 nm.

In the core, a mole ratio of indium to silver (In:Ag) may be greater than or equal to about 1.5:1, greater than or equal to about 1.8:1, greater than or equal to about 2:1, greater than or equal to about 2.1:1, greater than or equal to about 2.5:1, or greater than or equal to about 3.8:1. In the core, a mole ratio of indium to silver (In:Ag) may be less than or equal to about 10:1, less than or equal to about 8.5:1, less than or equal to about 8:1, less than or equal to about 7.5:1, less than or equal to about 6:1, or less than or equal to about 5:1.

In the core, a mole ratio of indium to sulfur (In:S) may be greater than or equal to about 0.1:1, greater than or equal to about 0.3:1, or greater than or equal to about 0.5:1. In the core, a mole ratio of indium to sulfur (In:S) may be less than or equal to about 1:1, or less than or equal to about 0.75:1.

In the semiconductor nanoparticles, a charge balance value defined by the following equation may be greater than or equal to about 0.8 and less than or equal to about 1.5:

$$\text{charge balance value} = \{[Ag] + 3([In] + [Ga])\}/2[S]$$

wherein [Ag], [In], [Ga], and [S] are moles of the silver, indium, gallium, and sulfur, respectively, in the semiconductor nanoparticles.

The charge balance value may be greater than or equal to about 1, greater than or equal to about 1.02, greater than or equal to about 1.05, greater than or equal to about 1.17, greater than or equal to about 1.18, or greater than or equal to about 1.19. The charge balance value may be less than or equal to about 1.45, less than or equal to about 1.3, less than or equal to about 1.2, or less than or equal to about 1.1.

In the semiconductor nanoparticles, a mole ratio of a sum of indium and gallium to silver ((In+Ga):Ag) may be greater than or equal to about 1.1:1, greater than or equal to about 1.2:1, greater than or equal to about 1.5:1, greater than or equal to about 1.6:1, greater than or equal to about 1.7:1, or greater than or equal to about 1.9:1.

In the semiconductor nanoparticles, a mole ratio of a sum of indium and gallium to silver ((In+Ga):Ag) may be less than or equal to about 3:1, less than or equal to about 2.5:1, less than or equal to about 2.3:1, less than or equal to about 2.1:1, less than or equal to about 2:1, or less than or equal to about 1.9:1.

In the semiconductor nanoparticles or in the core, a mole ratio of sulfur to silver (S:Ag) may be greater than or equal to about 2.5:1, greater than or equal to about 2.6:1, greater than or equal to about 2.7:1, greater than or equal to about 2.8:1, or greater than or equal to about 2.9:1. The mole ratio of sulfur to silver (S:Ag) may be less than or equal to about 10:1, less than or equal to about 7.5:1, less than or equal to about 5:1, or less than or equal to about 4.5:1.

In the semiconductor nanoparticles or in the core, a mole ratio of sulfur to a sum of silver, indium, and gallium (S:(Ag+In+Ga)) may be greater than or equal to about 0.65:1, greater than or equal to about 0.68:1, greater than or equal to about 1:1, or greater than or equal to about 1.05:1. In the semiconductor nanoparticles, the mole ratio (S/(Ag+In+Ga)) of sulfur to a sum of silver, indium, and gallium may be less than or equal to about 2.5:1, less than or equal to about 1.35:1, or less than or equal to about 1.1:1.

In the semiconductor nanoparticles, a mole ratio of gallium to a sum of indium and gallium (Ga:(In+Ga)) may be greater than or equal to about 0.5:1, greater than or equal to about 0.75:1, or greater than or equal to about 0.8:1. The mole ratio of gallium to a sum of indium and gallium (Ga:(In+Ga)) may be less than or equal to about 1:1, less than or equal to about 0.96:1, or less than or equal to about 0.85:1.

In the semiconductor nanoparticles, a mole ratio of gallium to sulfur (Ga:S) may be greater than or equal to about 0.3:1, greater than or equal to about 0.46:1, greater than or equal to about 0.47:1, greater than or equal to about 0.5:1, or greater than or equal to about 0.55:1. The mole ratio of gallium to sulfur (Ga:S) may less than about 1:1, less than or equal to about 0.98:1, less than or equal to about 0.92:1, less than or equal to about 0.9:1.

In the semiconductor nanoparticles, a mole ratio of indium to silver (In:Ag) may be less than or equal to about 0.6:1, less than or equal to about 0.5:1, less than or equal to about 0.45:1, or less than or equal to about 0.41:1. The mole ratio of indium to silver (In:Ag) may be greater than or equal to about 0.1:1, greater than or equal to about 0.2:1, or greater than or equal to about 0.3:1.

In the semiconductor nanoparticles, a mole ratio of indium to silver (Ga:Ag) may be greater than or equal to about 0.9:1, greater than or equal to about 1:1, or greater than or equal to about 1.2:1. The mole ratio of indium to silver (Ga:Ag) may be less than or equal to about 3:1, less than or equal to about 2.5:1, or less than or equal to about 1.5:1.

In the semiconductor nanoparticles, a mole ratio of silver to a sum of silver, indium, and gallium (Ag:(Ag+In+Ga)) may be greater than or equal to about 0.31:1, greater than or equal to about 0.33:1, or greater than or equal to about 0.36:1. In the semiconductor nanoparticles, the mole ratio of silver to a sum of silver, indium, and gallium (Ag:(Ag+In+Ga)) may be less than or equal to about 0.4:1, or less than or equal to about 0.37:1.

In the semiconductor nanoparticles, a mole ratio of a sum of indium and gallium to sulfur ((In+Ga):S) may be greater than or equal to about 0.55:1, greater than or equal to about 0.58:1, greater than or equal to about 0.68:1, or greater than or equal to about 0.73:1. The mole ratio of the sum of indium and gallium to sulfur ((In+Ga):S) may be less than or equal to about 1:1, or less than or equal to about 0.63:1.

The semiconductor nanoparticles may not include lithium.

The semiconductor nanoparticles may not include sodium.

The semiconductor nanoparticles may not include an alkali metal.

In the semiconductor nanoparticle, an amount (or a concentration, e.g., a weight percent or a mole percent) of gallium in a portion adjacent to a surface of the semiconductor nanoparticle (for example, in the shell) may be greater than in an inner portion thereof (for example, in the core).

The shell (or the semiconductor nanoparticle) may include (or may further include) an outermost layer or an inorganic layer including a zinc chalcogenide (for example, disposed on the second semiconductor nanocrystal or the shell).

A thickness of the shell may be greater than or equal to about 0.1 nm, greater than or equal to about 0.5 nm, or greater than or equal to about 0.7 nm. The thickness of the shell may be less than or equal to about 5 nm, less than or equal to about 1.5 nm, less than or equal to about 1 nm, or less than or equal to about 0.8 nm.

A thickness of the shell may be greater than or equal to about 0.01 times and less than or equal to about 0.9 times, greater than or equal to about 0.05 times and less than or equal to about 0.5 times of a radius of the semiconductor nanoparticle.

A thickness of the shell may be greater than or equal to about 0.01 times and less than or equal to about 0.9 times, greater than or equal to about 0.05 times and less than or equal to about 0.5 times of a diameter of the first semiconductor nanocrystal (or the core).

A thickness of the outermost layer (or the inorganic layer) may be greater than or equal to about 0.1 nm, greater than or equal to about 0.5 nm, or greater than or equal to about 0.7 nm. The thickness of the outermost layer (or the inorganic layer) may be less than or equal to about 5 nm, less than or equal to about 1.5 nm, less than or equal to about 1 nm, or less than or equal to about 0.8 nm.

A thickness of the outermost layer (or the inorganic layer) may be greater than or equal to about 0.01 times and less than or equal to about 0.9 times, greater than or equal to about 0.05 times and less than or equal to about 0.5 times of a radius of the semiconductor nanoparticle.

A thickness of the outermost layer (or the inorganic layer) may be greater than or equal to about 0.01 times and less than or equal to about 0.9 times, greater than or equal to about 0.05 times and less than or equal to about 0.5 times of a diameter of the first semiconductor nanocrystal (or the core).

A particle size (or an average particle size, at times, simply referred to as "size", e.g., a diameter) of the semiconductor nanoparticle may be greater than or equal to about 2.6 nm and less than or equal to about 10 nm. A size of the first semiconductor nanocrystal (or the core) may be greater than or equal to about 1.5 nm and less than or equal to about 5.5 nm.

In an embodiment, a method of producing the semiconductor nanoparticle includes obtaining the first semiconductor nanocrystal (or the core) including indium, silver, and sulfur;

heating a reaction medium including a first precursor, and optionally, an organic ligand, in an organic solvent to a first temperature;

adding the first semiconductor nanocrystal and a second precursor to the heated reaction medium, wherein if the first precursor is a gallium precursor then the second precursor is a sulfur precursor, or if the first precursor is a sulfur precursor then the second precursor is a gallium precursor; and heating the reaction medium to a second temperature for a first duration to form the semiconductor nanoparticle, wherein in the first semiconductor nanocrystal, a mole ratio of indium to silver (In:Ag) is greater than or equal to about 1.5:1 and less than or equal to about 10:1 (or less than or equal to about 5:1);

wherein the first temperature is greater than or equal to about 180° C. and less than or equal to about 280° C., and the second temperature is greater than or equal to about 240° C. and less than or equal to about 380° C.

In the method of an embodiment, a mole ratio of indium to sulfur (In:S) in the first semiconductor nanocrystal may be greater than or equal to about 0.1:1 and less than or equal to about 0.75:1.

The first temperature and the second temperature may be different. The second temperature may be greater than the first temperature.

The gallium precursor may include a gallium halide, gallium acetylacetonate, or a combination thereof. The organic solvent may include an aliphatic amine. The organic ligand may include a thiol compound. The sulfur precursor may include a thiourea compound.

In the preparation of the first semiconductor nanocrystal, a mole ratio of the indium precursor to silver may be greater than or equal to about 2.4:1 and less than or equal to about 15:1. In the preparation of the first semiconductor nanocrystal, a mole ratio of a sulfur precursor to silver may be greater than or equal to about 5:1, e.g., about 7:1, and less than or equal to about 30:1.

In an embodiment, a composite includes a matrix and the semiconductor nanoparticle dispersed in the matrix.

The composite may be a patterned film.

The composite may be a sheet in which the semiconductor nanoparticles emitting the green light and semiconductor nanoparticles emitting a second light different from the green light are mixed.

An amount of the semiconductor nanoparticles in the composite may be about 1 weight percent (wt %) to about 50 wt %, about 5 wt % to about 30 wt %, about 10 wt % to about 20 wt %, or about 15 wt % to about 20 wt %, or a range defined by any two of the aforementioned end values, based on a total weight of the composite.

An absorbance of incident light (e.g., blue light) by the composite may be greater than or equal to about 70%, greater than or equal to about 80%, greater than or equal to about 85%, or greater than or equal to about 90%. The incident light absorbance of the composite may be about 70% to 100%, about 80% to about 98%, about 95% to about 99%, about 96% to about 98%, or a combination thereof.

In an embodiment, a device includes a color conversion layer (for example, a color conversion structure) including a color conversion region including the semiconductor nanoparticle.

In an embodiment, a color conversion panel includes a color conversion layer (for example, a color conversion structure) including a color conversion region and optionally a partition wall defining each color conversion region of the color conversion layer. The color conversion region includes a first region corresponding to a first pixel and being configured to emit a first light (e.g., green light), the first region includes a first composite, and the first composite includes a matrix and the semiconductor nanoparticle of an embodiment dispersed in the matrix.

The (polymer) matrix may include a linear polymer, a crosslinked polymer, or a combination thereof.

The crosslinked polymer may include a thiolene polymer, a crosslinked poly(meth)acrylate, a crosslinked polyurethane, a crosslinked epoxy resin, a crosslinked vinyl polymer, a crosslinked silicone resin, or a combination thereof. The thiolene polymer may include a polymerization product of a monomer combination including a (polyfunctional or monofunctional) thiol compound having at least one thiol group at the terminal end and an ene compound having a carbon-carbon unsaturated bond.

The linear polymer may include a repeating unit derived from a carbon-carbon unsaturated bond (e.g., a carbon-carbon double bond). The repeating unit may include a carboxylic acid group. The linear polymer may include an ethylene repeating unit.

The carboxylic acid group-containing repeating unit may include a unit derived from a monomer including a carboxylic acid group and a carbon-carbon double bond, a unit derived from a monomer having a dianhydride moiety, or a combination thereof.

The first composite may further include metal oxide fine particles.

The first composite may be in a form of a patterned film.

In an embodiment, an ink composition includes a liquid vehicle and the semiconductor nanoparticle (or a population thereof) described herein. The ink composition may be substantially free of a volatile organic solvent.

The semiconductor nanoparticles may be dispersed within the liquid vehicle.

The liquid vehicle may include a liquid monomer, an organic solvent, or a combination thereof.

The ink composition may further include a metal oxide fine particle.

In an embodiment, a display panel or a display device includes a light source and the color conversion layer (e.g., the color conversion structure) described herein.

In an embodiment, a display panel may include a light emitting panel (or a light source) and the color conversion panel, and optionally a light transmitting layer between the light emitting panel and the color conversion panel.

The light emitting panel (or light source) may be configured to provide an incident light to the color conversion panel. The incident light may include blue light and optionally, green light. The blue light may have a peak wavelength in the range of about 420 nm to about 480 nm, about 440 nm to about 460 nm or about 450 nm to about 455 nm.

The light source may include an organic light emitting diode, a micro LED, a mini LED, an LED including a nanorod, or a combination thereof.

In an embodiment, the electronic device (or display device) includes the color conversion panel or the display panel.

The semiconductor nanoparticles according to an embodiment may exhibit improved properties (e.g., an improved incident light absorbance, and/or an improved quantum yield) and may bring the production cost down for the making of a device (for example, a display panel) including the semiconductor nanoparticles. The color conversion panel of an embodiment may utilize various light sources and may be usefully utilized in a liquid crystal display device, a QD OLED device, and a QD micro LED display device in which QD CF is applied to a blue micro LED. The semiconductor nanoparticles of an embodiment and the color conversion panel of an embodiment may be applied to various devices such as TVs, monitors, mobile devices, VR/AR, automotive displays, and the like.

BRIEF DESCRIPTION OF THE DRAWINGS

FIG. 6 is a cross-sectional representation of the display panel of FIG. 5A taken along line IV-IV.

FIG. 6B is a schematic cross-sectional representation of a display device (e.g., a liquid crystal display device) according to an embodiment.

DETAILED DESCRIPTION

Figure 1A:
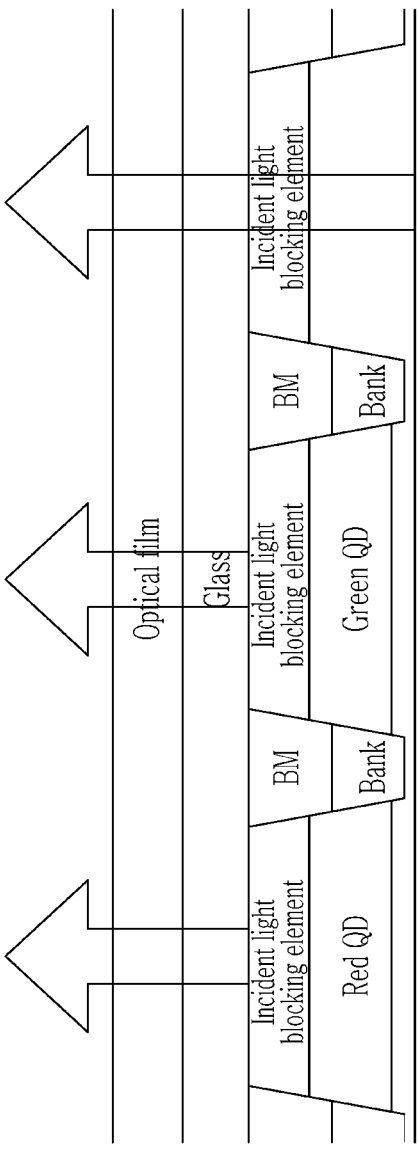
FIG. 1A is a schematic cross-sectional representation of a color conversion panel of an embodiment.

Advantages and features of the techniques described hereinafter, and methods of achieving them, will become apparent with reference to the embodiments described below in detail in conjunction with the accompanying drawings. This invention may, however, be embodied in many different forms, and should not be construed as being limited to the embodiments set forth herein. In the drawings, the thickness of layers, films, panels, regions, etc., are exaggerated for clarity. Like reference numerals designate like elements throughout the specification.

If not defined otherwise, all terms (including technical and scientific terms) in the specification may be defined as commonly understood by one skilled in the art. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±10%, or 5% of the stated value.

As used herein, the expression "not including cadmium (or other harmful heavy metal)" may refer to the case in which a concentration of cadmium (or other harmful heavy metal) may be less than or equal to about 100 parts per million by weight (ppmw), less than or equal to about 50 ppmw, less than or equal to about 10 ppmw, less than or equal to about 1 ppmw, less than or equal to about 0.1 ppmw, less than or equal to about 0.01 ppmw, or about zero. In an embodiment, substantially no amount of cadmium (or other harmful heavy metal) may be present or, if present, an amount of cadmium (or other harmful heavy metal) may be less than or equal to a detection limit or as an impurity level of a given analysis tool.

As used herein, if a definition is not otherwise provided, "substituted" refers to being replaced hydrogen of a compound by a substituent selected from a C1 to C30 alkyl group, a C2 to C30 alkenyl group, a C2 to C30 alkynyl group, a C6 to C30 aryl group, a C7 to C30 alkylaryl group, a C1 to C30 alkoxy group, a C1 to C30 heteroalkyl group, a C3 to C30 heteroalkylaryl group, a C3 to C30 cycloalkyl group, a C3 to C15 cycloalkenyl group, a C6 to C30 cycloalkynyl group, a C2 to C30 heterocycloalkyl group, a halogen (—F, —Cl, —Br, or —I), a hydroxy group (—OH), a nitro group (—NO$_2$), a cyano group (—CN), an amino group (—NRR' wherein R and R' are each independently hydrogen or a C1 to C6 alkyl group), an azido group (—N$_3$), an amidino group (—C(=NH)NH$_2$), a hydrazino group (—NHNH$_2$), a hydrazono group (=N(NH$_2$)), an aldehyde group (—C(=O)H), a carbamoyl group (—C(O)NH$_2$), a thiol group (—SH), an ester group (—C(=O)OR, wherein R is a C1 to C6 alkyl group or a C6 to C12 aryl group), a carboxyl group (—COOH) or a salt thereof (—C(=O)OM, wherein M is an organic or inorganic cation, a sulfonic acid group (—SO$_3$H) or a salt thereof (—SO$_3$M, wherein M is an organic or inorganic cation), a phosphoric acid group (—PO$_3$H$_2$) or a salt thereof (—PO$_3$MH or -PO$_3$M$_2$, wherein M is an organic or inorganic cation), or a combination thereof.

In addition, if a definition is not otherwise provided, "hetero" means the case where 1 to 3 heteroatoms selected from N, O, S, Si, or P is or are included.

In addition, "aliphatic hydrocarbon group" refers to a C1 to C30 linear or branched alkyl group, a C1 to C30 linear or branched alkenyl group, or a C1 to C30 linear or branched alkynyl group, and "aromatic organic group" refers to a C6 to C30 aryl group or a C2 to C30 heteroaryl group.

As used herein, the term "(meth)acrylate" refers to acrylate and/or methacrylate.

As used herein, "Group" refers to a Group of Periodic Table.

As used herein, a nanoparticle refers to a structure having at least one region or characteristic dimension with a nanoscale dimension. In an embodiment, the dimension of the nanoparticle or the nanostructure may be less than about 500 nm, less than about 300 nm, less than about 250 nm, less than about 150 nm, less than about 100 nm, less than about 50 nm, or less than about 30 nm. The nanoparticle or the nanostructure may have any shape. The nanoparticle or nanostructure may have any shape, such as a nanowire, a nanorod, a nanotube, a multi-pod type shape having two or more pods, a nanodot, which is not limited. The nanoparticle or nanostructure may be, for example, substantially crystalline, substantially monocrystalline, polycrystalline, amorphous, or a combination thereof.

A quantum dot may be a, e.g., semiconductor-based nanocrystal particle that can exhibit a quantum confinement or exciton confinement effect and is a type of a luminescent nanostructure (e.g., capable of emitting light by energy excitation). Herein, a shape of the "quantum dot" or the nanoparticle is not limited unless otherwise defined.

As used herein, the term "dispersion" refers to a dispersion in which a dispersed phase is a solid, and a continuous medium includes a liquid or a solid different from the dispersed phase. Herein, the "dispersion" may be a colloidal dispersion in which the dispersed phase has a dimension of greater than or equal to about 1 nm, for example, greater than or equal to about 2 nm, greater than or equal to about 3 nm, or greater than or equal to about 4 nm and several micrometers (μm) or less, (e.g., less than or equal to about 2 μm, or less than or equal to about 1 μm, less than or equal to about 900 nm, less than or equal to about 800 nm, less than or equal to about 700 nm, less than or equal to about 600 nm, or less than or equal to about 500 nm.

As used herein, a dimension (a size, a diameter, or a thickness, etc.) may be a value for a single entity or an average value for a plurality of particles. As used herein, the term "average" (e.g., an average size of the quantum dot) may be mean or median. In an embodiment, the average may be "mean" average.

As used herein, the term "emission peak wavelength" is the wavelength at which a given emission spectrum of the light reaches its maximum.

In an embodiment, a quantum efficiency may be easily and reproducibly determined using commercially available equipment (e.g., from Hitachi or Hamamatsu, etc.) and referring to manuals provided by, for example, respective equipment manufacturers. The quantum efficiency (which can be interchangeably used with the term "quantum yield" (QY)) may be measured in a solution state or a solid state (in a composite). In an embodiment, the quantum efficiency (or the quantum yield) is the ratio of photons emitted to photons absorbed by the nanostructure or population thereof. In an embodiment, the quantum efficiency may be measured by any method. For example, there may be two methods for measuring the fluorescence quantum yield or efficiency: the absolute method and the relative method. The quantum efficiency measured by the absolute method may be referred to as an absolute quantum efficiency.

In the absolute method, the quantum efficiency may be obtained by detecting the fluorescence of all samples through an integrating sphere. In the relative method, the quantum efficiency of the unknown sample is calculated by comparing the fluorescence intensity of a standard dye (standard sample) with the fluorescence intensity of the unknown sample. Coumarin 153, Coumarin 545, Rhodamine 101 inner salt, Anthracene and Rhodamine 6G may be used as standard dyes according to their PL wavelengths, but the present disclosure is not limited thereto.

A full width at half maximum and an emission peak wavelength may be measured, for example, from a luminescence spectrum (for example, a photoluminescence spectrum or an electroluminescent spectrum) obtained by a spectrophotometer such as a fluorescence spectrophotometer or the like.

As used herein, the term "first absorption peak wavelength" refers to a wavelength at which a main peak first appears in a lowest energy region in the UV-Vis absorption spectrum.

A semiconductor nanoparticle may be included in a variety of electronic devices. An electronic and/or an optical property of the semiconductor nanoparticle may be controlled for example, by its elemental composition, its size, its shape, or a combination. In an embodiment, the semiconductor nanoparticle may include a semiconductor nanocrystal. The semiconductor nanoparticle such as a quantum dots may have a relatively large surface area per a unit volume, and thus, may exhibit a quantum confinement effect, exhibiting physical optical properties different from a corresponding bulk material having the same composition. Therefore, a luminescent nanoparticle such as a quantum dot may absorb energy (e.g., incident light) supplied from an excitation source to form an excited state, which upon relaxation is capable of emitting an energy corresponding to its bandgap energy.

The semiconductor nanoparticle may be also used in a color conversion panel (e.g., a photoluminescent color filter). Instead of a white light-emitting backlight unit used in a liquid crystal display device, a display device including a quantum dot-based color conversion panel or a luminescent type color filter may use a quantum dot layer as a luminescent material and includes the same in a relatively front part of a device to convert an incident light (e.g., blue light) provided from a light source to light of a different spectrum (for example, a green light or a red light). In such a color conversion panel, the color conversion of the incident light may occur in a relatively front part of the device, and the light may be scattered in all directions, which may address a viewing angle problem of the liquid crystal display, and a light loss problem caused by using an absorption type color filter may be addressed as well. In an embodiment, the "color conversion panel" is a device (e.g., an electronic device) including a color conversion layer or a color conversion structure. From an environmental perspective, it is desirable to develop a luminescent semiconductor nanoparticle that does not contain a harmful heavy metal such as cadmium, and still exhibit an improved luminescent property, e.g., quantum efficiency and/or chemical stability or stability of a corresponding electronic device.

In the display device including the color conversion panel, a property (e.g., an optical property, stability, and the like) of a semiconductor nanoparticle used as a light emitting material may have a direct effect on a display or viewing quality of the device. It may be desired for the luminescent material included in the color conversion panel disposed in a relatively front portion of the device to exhibit not only a relatively high luminous efficiency but also a relatively high absorbance with respect to an incident light. In a use as a patterned film (e.g., for a color filter) in the display device, a relatively low absorbance to the incident light may be a direct cause of a blue light leakage, having an adversely effect on a color reproducibility (e.g., DCI match rate) of the device. In an embodiment, an adoption of an absorption type color filter may be considered as a measure for preventing such a blue leakage problem. However, without wishing to be bound by any theory, it is believed that a relatively low absorbance of the semiconductor nanoparticle may result in a decrease in a luminance of a device including the same.

Some semiconductor nanoparticles may show properties (e.g., optical properties and/or stability) applicable to an actual device but many of them are based on a cadmium-based compounds (e.g., cadmium chalcogenide). As the cadmium is one of the restricted elements possibly causing a serious environment/health issue, developing a cadmium-free environment-friendly semiconductor nanoparticle is still desirable and many in-depth researches on a Group III-V compound-based nanocrystal has been conducted in this respect. However, it is still desirable to develop a cadmium-free semiconductor nanoparticle that can show a higher incident light absorbance and a narrower full width at half maximum besides a cadmium-free semiconductor nanoparticle including the Group III-V compound (e.g., based on an indium phosphide). For example, it is desired to develop a semiconductor nanoparticle capable of exhibiting a higher absorption coefficient thereof even when it has a structure and a composition being configured to emit green light.

The semiconductor nanoparticle may be used, for example, in a color conversion panel disposed in a relatively front part of a device. In a color conversion pixel, incident light (e.g., blue light) absorption by the semiconductor nanoparticle may be governed by the beer-lambert law, and an absorption coefficient of the nanoparticle may have an effect on the absorbance of the panel. As the color conversion pixel may include a predetermined weight of the semiconductor nanoparticle, the number of the particles per a weight may also affect the absorbance of the panel.

Therefore, there remains a technological need to develop an environmentally friendly semiconductor nanoparticle that can exhibit a higher absorbance, a narrower half maximum width, and a higher luminous efficiency.

In an embodiment, a semiconductor nanoparticle may not include cadmium. In an embodiment, the semiconductor nanoparticle may not include mercury, lead, or a combination thereof.

In an embodiment, the semiconductor nanoparticle includes silver, a Group 13 metal, and a chalcogen element. In an embodiment, the semiconductor nanoparticle is configured to emit green light. By having the structure/composition described herein, the semiconductor nanoparticle of an embodiment may emit light of a desired wavelength and may achieve an improved optical property (e.g., a narrow full width at half maximum, an increased quantum yield, and a relatively high level of a blue light absorbance). The semiconductor nanoparticle of an embodiment may be, for example, utilized as a down-conversion material for a color conversion panel or a color conversion sheet, and may exhibit an increased absorption per a weight of the semiconductor nanoparticle. As a result, a device (e.g., a panel or a sheet) including the semiconductor nanoparticle may be manufactured at a reduced production cost and may provide an improved photoconversion performance. In an embodiment, the semiconductor nanoparticle may exhibit a reduced or suppressed emission (e.g., trap emission) in an unwanted (undesired) wavelength range.

In an embodiment, the Group 13 metal includes gallium and indium, aluminum, or a combination thereof) and the chalcogen element includes sulfur, and optionally selenium. The semiconductor nanoparticle is configured to emit green light. The green light or the semiconductor nanoparticle may have an emission peak wavelength of greater than or equal to about 500 nm, greater than or equal to about 505 nm, and less than or equal to about 580 nm, or less than or equal to about 550 nm.

In the semiconductor nanoparticle, a mole ratio of a sum of indium and gallium to silver ((In+Ga):Ag) may be greater than or equal to about 1:1, greater than or equal to about 1.5:1 and less than or equal to about 3.5:1, or less than or equal to about 3:1. The semiconductor nanoparticles may have a core-shell structure including a core (for example, including silver, indium, and sulfur) and a shell disposed on the core. In the semiconductor nanoparticles, an amount of gallium is greater in the shell than in the core. The core may not include gallium.

The present inventors have found that it would be difficult for the semiconductor nanoparticle including a Group 13 metal and a chalcogen element along with silver (Ag) to achieve desired luminous properties (for example, both of a narrower full width at half maximum and a higher quantum yield) simultaneously. In addition, the present inventors have found that most of the semiconductor nanoparticle including the Group 13 metal and the chalcogen element along with the silver prepared according to the prior art may provide a substantial amount of trap emission together with a band-edge emission, and resulting in an emission at an unwanted wavelength, for example, a wavelength significantly shifted to a longer wavelength than the maximum emission peak wavelength based on band-edge emission. This unwanted emission, hereinafter referred to as a trap emission wavelength, may account for a considerable portion of the emission in the light emitted from the semiconductor nanoparticle.

Surprisingly, however the present inventors have found that the semiconductor nanoparticle of an embodiment may achieve a desired optical property by having the characteristics, e.g., compositional characteristics, described herein.

In an embodiment, in the semiconductor nanoparticle, a mole ratio of a sum of indium and gallium to silver ((In+Ga):Ag) may be greater than or equal to about 1:1, greater than or equal to about 1.5:1 and less than or equal to about 3.5:1. In an embodiment, a gallium amount (or a gallium concentration) may have a concentration gradient (or gradient) described herein. The semiconductor nanoparticle (or the core) may not include copper.

In the core (or in a first semiconductor nanocrystal) described herein, a mole ratio of indium to silver (In:Ag) may be greater than or equal to about 1.5:1, greater than or equal to about 1.6:1, greater than or equal to about 1.7:1, greater than or equal to about 1.8:1, greater than or equal to about 1.9:1, greater than or equal to about 2:1, greater than or equal to about 2.1:1, greater than or equal to about 2.2:1, greater than or equal to about 2.3:1, greater than or equal to about 2.4:1, greater than or equal to about 2.5:1, greater than or equal to about 2.6:1, greater than or equal to about 2.7:1, greater than or equal to about 2.8:1, greater than or equal to about 2.9:1, greater than or equal to about 3:1, greater than or equal to about 3.1:1, greater than or equal to about 3.2:1, greater than or equal to about 3.3:1, greater than or equal to about 3.4:1, greater than or equal to about 3.5:1, greater than or equal to about 3.6:1, greater than or equal to about 3.7:1, greater than or equal to about 3.8:1, greater than or equal to about 3.9:1, or greater than or equal to about 4:1. In the core (or in a first semiconductor nanocrystal) described herein, a mole ratio of indium to silver (In:Ag) may be less than or equal to about 10:1, less than or equal to about 8:1, less than or equal to about 7.5:1, less than or equal to about 6:1, less than or equal to about 5.5:1, less than or equal to about 5:1, less than or equal to about 4.5:1, less than or equal to about 4.3:1, less than or equal to about 4:1, less than or equal to about 3.5:1, less than or equal to about 3:1, less than or equal to about 2.7:1, less than or equal to about 2.5:1, or less than or equal to about 2.2:1.

In the core (or in a first semiconductor nanocrystal) described herein, a mole ratio of indium to sulfur (In:S) may be greater than or equal to about 0.1:1, greater than or equal to about 0.2:1, greater than or equal to about 0.3:1, greater than or equal to about 0.4:1, greater than or equal to about 0.5:1, greater than or equal to about 0.51:1, or greater than or equal to about 5.4:1. In the core (or in a first semiconductor nanocrystal) described herein, a mole ratio of indium to sulfur (In:S) may be less than or equal to about 1:1, less than or equal to about 0.8:1, less than or equal to about 0.75:1, less than or equal to about 0.7:1, less than or equal to about 0.65:1, less than or equal to about 0.6:1, less than or equal to about 0.58:1, less than or equal to about 0.56:1.

The semiconductor nanoparticle has a charge balance value defined by the following equation of greater than or equal to about 0.8 and less than or equal to about 1.5.

$$\text{charge balance value} = \{[Ag] + 3([In] + [Ga])\}/2[S]$$

wherein [Ag], [In], [Ga], and [S] are moles of silver, indium, gallium, and sulfur, respectively, in the semiconductor nanoparticle.

Without wishing to be bound by any theory, in the semiconductor nanoparticle of an embodiment, the charge balance value may indicate that in the semiconductor nanoparticle of an embodiment, an amount of an unwanted by-products (e.g., gallium oxide) is considerably reduced or suppressed.

In an embodiment, the charge balance value may be less than about 1.5, less than or equal to about 1.45, less than or equal to about 1.4, less than or equal to about 1.35, less than or equal to about 1.34, less than or equal to about 1.33, less than or equal to about 1.32, less than or equal to about 1.31, less than or equal to about 1.3, less than or equal to about 1.29, less than or equal to about 1.28, less than or equal to about 1.27, less than or equal to about 1.26, less than or equal to about 1.25, less than or equal to about 1.24, less than or equal to about 1.23, less than or equal to about 1.22, less than or equal to about 1.21, or less than or equal to about 1.2.

The charge balance value may be greater than or equal to about 0.81, greater than or equal to about 0.85, greater than or equal to about 0.9, greater than or equal to about 0.95, greater than or equal to about 0.97, greater than or equal to about 0.99, greater than or equal to about 1, greater than or equal to about 1.01, greater than or equal to about 1.02, greater than or equal to about 1.03, greater than or equal to about 1.04, greater than or equal to about 1.05, greater than or equal to about 1.06, greater than or equal to about 1.07, greater than or equal to about 1.08, greater than or equal to about 1.09, greater than or equal to about 1.1, greater than or equal to about 1.11, greater than or equal to about 1.12, greater than or equal to about 1.13, greater than or equal to about 1.14, greater than or equal to about 1.15, greater than or equal to about 1.16, greater than or equal to about 1.17, greater than or equal to about 1.18, greater than or equal to about 1.19, greater than or equal to about 1.2, greater than or equal to about 1.21, greater than or equal to about 1.22, greater than or equal to about 1.23, greater than or equal to about 1.24, or greater than or equal to about 1.25.

In the semiconductor nanoparticle of an embodiment, a mole ratio of a sum of indium and gallium to silver ((In+Ga):Ag) may be greater than or equal to about 1:1, greater than or equal to about 1.25:1, greater than or equal to about 1.5:1, greater than or equal to about 1.55:1, greater than or equal to about 1.6:1, greater than or equal to about 1.65:1, greater than or equal to about 1.7:1, greater than or equal to about 1.75:1, greater than or equal to about 1.8:1, greater than or equal to about 1.85:1, greater than or equal to about 1.9:1, or greater than or equal to about 2:1. The mole ratio of a sum of indium and gallium to silver ((In+Ga):Ag) may be less than or equal to about 3.5:1, less than or equal to about 3.2:1, less than or equal to about 3:1, less than or equal to about 2.8:1, less than or equal to about 2.6:1, less than or equal to about 2.4:1, less than or equal to about 2.2:1, less than or equal to about 2:1, less than or equal to about 1.9:1, less than or equal to about 1.85:1, less than or equal to about 1.8:1, or less than or equal to about 1.75:1.

In the semiconductor nanoparticle of an embodiment, a mole ratio of sulfur to a sum of silver, indium, and gallium (S:(Ag+In+Ga)) may be greater than or equal to about 0.65:1, greater than or equal to about 0.68:1, greater than or equal to about 0.7:1, greater than or equal to about 0.75:1, greater than or equal to about 0.8:1, greater than or equal to about 0.85:1, greater than or equal to about 0.9:1, greater than or equal to about 0.95:1, greater than or equal to about 0.99:1, greater than or equal to about 1.03:1, or greater than or equal to about 1.07:1. In the semiconductor nanoparticle, the mole ratio of sulfur to a sum of silver, indium, and gallium (S:(Ag+In+Ga)) may be less than or equal to about 2.5:1, less than or equal to about 2:1, less than or equal to about 1.7:1, less than or equal to about 1.5:1, less than or equal to about less than or equal to about 1.35:1, less than or equal to about 1.33:1, less than or equal to about 1.3:1, less than or equal to about 1.25:1, less than or equal to about 1.2:1, less than or equal to about 1.17:1, less than or equal to about 1.15:1, less than or equal to about 1.09:1, less than or equal to about 1.08:1, less than or equal to about 1.07:1, less than or equal to about 1.06:1, less than or equal to about 1.05:1, less than or equal to about 1.04:1, less than or equal to about 1.03:1, or less than or equal to about 1.02:1.

In the semiconductor nanoparticle, a mole ratio of sulfur to silver (S:Ag) may be greater than or equal to about 2.5:1, greater than or equal to about 2.6:1, greater than or equal to about 2.7:1, greater than or equal to about 2.8:1, or greater than or equal to about 2.9:1. The mole ratio of sulfur to silver (S:Ag) may be less than or equal to about 10:1, less than or equal to about 7.5:1, less than or equal to about 5:1, or less than or equal to about 4.5:1.

In the semiconductor nanoparticle, a mole ratio of indium to silver (In:Ag) may be less than or equal to about 0.6:1, less than or equal to about 0.55:1, less than or equal to about 0.5:1, less than or equal to about 0.45:1, or less than or equal to about 0.41:1. The mole ratio of indium to silver (In:Ag) may be greater than or equal to about 0.1:1, greater than or equal to about 0.15:1, greater than or equal to about 0.2:1, greater than or equal to about 0.25:1, greater than or equal to about 0.3:1, greater than or equal to about 0.35:1, greater than or equal to about 0.4:1, or greater than or equal to about 0.45:1.

In the semiconductor nanoparticle, a mole ratio of gallium to silver (Ga:Ag) may be greater than or equal to about 0.9:1, greater than or equal to about 0.95:1, greater than or equal to about 1:1, greater than or equal to about 1.1:1, greater than or equal to about 1.15:1, greater than or equal to about 1.2:1, greater than or equal to about 1.25:1, or greater than or equal to about 1.3:1. The mole ratio of gallium to silver (Ga:Ag) may be less than or equal to about 3:1, less than or equal to about 2.7:1, less than or equal to about 2.5:1, less than or equal to about 2.4:1, less than or equal to about 2.3:1, less than or equal to about 2.2:1, less than or equal to about 2.1:1, less than or equal to about 2:1, less than or equal to about 1.9:1, less than or equal to about 1.8:1, less than or equal to about 1.7:1, less than or equal to about 1.6:1, less than or equal to about 1.5:1, or less than or equal to about 1.4:1.

In the semiconductor nanoparticle of an embodiment, a mole ratio of gallium to a sum of indium and gallium (Ga:(Ga+In)) may be greater than or equal to about 0.5:1, greater than or equal to about 0.55:1, greater than or equal to about 0.6:1, greater than or equal to about 0.65:1, greater than or equal to about 0.7:1, greater than or equal to about 0.75:1, greater than or equal to about 0.8:1, greater than or equal to about 0.84:1, greater than or equal to about 0.85:1, or greater than or equal to about 0.88:1. The mole ratio of gallium to a sum of indium and gallium (Ga:(Ga+In)) may be less than 1:1, less than or equal to about 0.99:1, less than or equal to about 0.98:1, less than or equal to about 0.97:1, less than or equal to about 0.96:1, less than or equal to about 0.95:1, less than or equal to about 0.94:1, less than or equal to about 0.93:1, less than or equal to about 0.92:1, less than or equal to about 0.91, less than or equal to about 0.9:1, less than or equal to about 0.85:1, less than or equal to about 0.83:1, or less than or equal to about 0.82:1.

In the semiconductor nanoparticle, a mole ratio of gallium to sulfur (Ga:S) may be greater than or equal to about 0.3:1, greater than or equal to about 0.35:1, greater than or equal to about 0.4:1, greater than or equal to about 0.45:1, greater than or equal to about 0.47:1, greater than or equal to about 0.5:1, greater than or equal to about 0.52:1, greater than or equal to about 0.53:1, greater than or equal to about 0.55:1, greater than or equal to about 0.56:1, greater than or equal to about 0.58:1, greater than or equal to about 0.6:1, or greater than or equal to about 0.62:1. The mole ratio of gallium to sulfur (Ga:S) may be less than or equal to about 1:1, less than or equal to about 0.9:1, less than or equal to about 0.8, less than or equal to about 0.75:1, less than or equal to about 0.65:1, less than or equal to about 0.62:1, less than or equal to about 0.58:1, or less than or equal to about 0.55:1.

In the semiconductor nanoparticle, a mole ratio of silver to sulfur (Ag:S) may be greater than or equal to about 0.1:1, greater than or equal to about 0.15:1, greater than or equal to about 0.2:1, greater than or equal to about 0.25:1, greater than or equal to about 0.3:1, greater than or equal to about 0.31:1, greater than or equal to about 0.32:1, greater than or equal to about 0.33:1, greater than or equal to about 0.35:1, greater than or equal to about 0.38:1, greater than or equal to about 0.4:1, or greater than or equal to about 0.45:1. The mole ratio of silver to sulfur (Ag:S) may be less than or equal to about 1:1, less than or equal to about 0.6:1, less than or equal to about 0.5:1, less than or equal to about 0.4:1, less than or equal to about 0.38:1, or less than or equal to about 0.36:1.

In the semiconductor nanoparticle of an embodiment, a mole ratio of indium to sulfur (In:S) may be greater than or equal to about 0.01:1, greater than or equal to about 0.03:1, greater than or equal to about 0.05:1, greater than or equal to about 0.08:1, greater than or equal to about 0.09:1, or greater than or equal to about 0.1:1. The mole ratio of indium to sulfur (In:S) may be less than or equal to about 0.5:1, less than or equal to about 0.4:1, less than or equal to about 0.3:1, less than or equal to about 0.25:1, less than or equal to about 0.15:1, less than or equal to about 0.14:1, less than or equal to about 0.13:1, less than or equal to about 0.12:1, or less than or equal to about 0.11:1.

In the semiconductor nanoparticle, a mole ratio of a sum of indium and gallium to sulfur (In+Ga):S may be greater than or equal to about 0.56:1, greater than or equal to about 0.57:1, or greater than or equal to about 0.58:1. The mole ratio of the sum of indium and gallium to sulfur ((In+Ga):S) may be less than or equal to about 1:1, or less than or equal to about 0.62:1.

In the semiconductor nanoparticle, a mole ratio of silver to a sum of silver, indium, and gallium (Ag:(Ag+In+Ga)) may be greater than or equal to about 0.31:1, greater than or equal to about 0.32:1, greater than or equal to about 0.33:1, or greater than or equal to about 0.34:1. In the semiconductor nanoparticle, the mole ratio of silver to a sum of silver, indium, and gallium (Ag:(Ag+In+Ga)) may be less than or equal to about 0.45:1, less than or equal to about 0.4:1, less than or equal to about 0.39:1, less than or equal to about 0.385:1, less than or equal to about 0.37:1, less than or equal to about 0.36:1, or less than or equal to about 0.34:1.

In the semiconductor nanoparticle of an embodiment, a mole ratio of indium to sulfur (In:S) may be greater than or equal to about 0.01:1, greater than or equal to about 0.05:1, greater than or equal to about 0.08:1, or greater than or equal to about 0.09:1. The mole ratio of indium to sulfur (In:S) may be less than or equal to about 0.5:1, less than or equal to about 0.4:1, less than or equal to about 0.3:1, less than or equal to about 0.25:1, or less than or equal to about 0.15:1.

In an embodiment, the semiconductor nanoparticle may not include lithium. The semiconductor nanoparticle may not include an alkali metal such as sodium, potassium, or the like.

In the semiconductor nanoparticle, an amount of the gallium may have a concentration gradient that varies, e.g., that decreases, in a radial direction (e.g., from its center or core to the core surface or to the shell). In the semiconductor nanoparticle of an embodiment, a gallium amount may be greater in a portion adjacent (proximate) to a surface (e.g., an outermost layer or a shell layer) of the semiconductor nanoparticle than of an inner portion or a core of the semiconductor nanoparticle.

In an embodiment, a portion proximate (or adjacent) to a surface (or a shell) of the particle may not include gallium.

In an embodiment, a center portion (or core) of the particle may not include gallium, selenium, zinc, or a combination thereof.

In an embodiment, the semiconductor nanoparticle may have a structure including a first semiconductor nanocrystal (or a core including the first semiconductor nanocrystal) and a second semiconductor nanocrystal (or a shell including the second semiconductor nanocrystal). The second semiconductor nanocrystal may be disposed on the first semiconductor nanocrystal. The second semiconductor nanocrystal may surround the first semiconductor nanocrystal. The first semiconductor nanocrystal may have a different composition from the second semiconductor nanocrystal. The semiconductor nanoparticle or the shell may further include an inorganic layer (for example, including a third semiconductor nanocrystal) including a zinc chalcogenide for example as an outermost layer thereof. The zinc chalcogenide may include zinc; and selenium, sulfur, or a combination thereof. The zinc chalcogenide may include a zinc sulfide, a zinc selenide, a zinc sulfide selenide, or a combination thereof. A bandgap energy of the second semiconductor nanocrystal may be less than a bandgap energy of the third semiconductor nanocrystal. The second semiconductor nanocrystal may be disposed between the first semiconductor nanocrystal and the inorganic layer.

A size (or average size, hereinafter, can be simply referred to as "size") of the first semiconductor nanocrystal or the core may be greater than or equal to about 0.5 nm, greater than or equal to about 1 nm, greater than or equal to about 1.5 nm, greater than or equal to about 1.7 nm, greater than or equal to about 1.9 nm, greater than or equal to about 2 nm, greater than or equal to about 2.1 nm, greater than or equal to about 2.3 nm, greater than or equal to about 2.5 nm, greater than or equal to about 2.7 nm, greater than or equal to about 2.9 nm, greater than or equal to about 3 nm, greater than or equal to about 3.1 nm, greater than or equal to about 3.3 nm, greater than or equal to about 3.5 nm, greater than or equal to about 3.7 nm, or greater than or equal to about 3.9 nm. The size of the first semiconductor nanocrystal or the core may be less than or equal to about 5 nm, less than or equal to about 4.5 nm, less than or equal to about 4 nm, less than or equal to about 3.5 nm, less than or equal to about 3 nm, less than or equal to about 2.5 nm, less than or equal to about 2 nm, or less than or equal to about 1.5 nm.

A thickness (or an average thickness, hereinafter, simply referred to as thickness) of the second semiconductor nanocrystal or the shell may be greater than or equal to about 0.1 nm, greater than or equal to about 0.3 nm, greater than or equal to about 0.5 nm, or greater than or equal to about 0.7 nm. The thickness of the second semiconductor nanocrystal or the shell may be less than or equal to about 5 nm, less than or equal to about 4.5 nm, less than or equal to about 4 nm, less than or equal to about 3.5 nm, less than or equal to about 3 nm, less than or equal to about 2.5 nm, less than or equal to about 2 nm, less than or equal to about 1.5 nm, less than or equal to about 1 nm, or less than or equal to about 0.8 nm.

A thickness of the outermost layer or the inorganic layer may be greater than or equal to about 0.1 nm, greater than or equal to about 0.3 nm, greater than or equal to about 0.5 nm, or greater than or equal to about 0.7 nm. The thickness of the outermost layer or the inorganic layer may be less than or equal to about 5 nm, less than or equal to about 4.5 nm, less than or equal to about 4 nm, less than or equal to about 3.5 nm, less than or equal to about 3 nm, less than or equal to about 2.5 nm, less than or equal to about 2 nm, less than or equal to about 1.5 nm, less than or equal to about 1 nm, or less than or equal to about 0.8 nm. A thickness of the outermost layer or the inorganic layer may be from about 0.1 nm to about 5 nm, from about 0.3 nm to about 4 nm, from about 0.5 nm to about 3.5 nm, from about 0.7 nm to about 3 nm, from about 0.9 nm to about 2.5 nm, from about 1 nm to about 2 nm, from about 1.5 nm to about 1.7 nm, or a combination thereof.

The thickness of the shell or the second semiconductor nanocrystal may be about 0.01 times or more, about 0.03 times or more, about 0.05 times or more, about 0.07 times or more, about 0.1 times or more, about 0.12 times or more, about 0.15 times or more, about 0.17 times or more, about 0.2 times or more, about 0.23 times or more, about 0.25 times or more, about 0.27 times or more, about 0.3 times or more, about 0.32 times or more, about 0.35 times or more, about 0.37 times or more, about 0.39 times or more, about 0.4 times or more, about 0.45 times or more, about 0.5 times or more, about 0.55 times or more, or about 0.6 times or more of a radius of the semiconductor nanoparticle. The thickness of the shell or the second semiconductor nanocrystal may be about 0.9 times or less, about 0.8 times or less, about 0.6 times or less, about 0.5 times or less, about 0.5 times or less, about 0.4 times or less, or about 0.35 times or less of a radius of the semiconductor nanoparticle.

The thickness of the shell or the second semiconductor nanocrystal may be about 0.01 times or more, about 0.03 times or more, about 0.05 times or more, about 0.07 times or more, about 0.1 times or more, about 0.12 times or more, about 0.15 times or more, about 0.17 times or more, about 0.2 times or more, about 0.23 times or more, about 0.25 times or more, about 0.27 times or more, about 0.3 times or more, about 0.32 times or more, about 0.35 times or more, about 0.37 times or more, about 0.39 times or more, about 0.4 times or more, about 0.45 times or more, about 0.5 times or more, about 0.55 times or more, or about 0.6 times or more of a diameter of the first semiconductor nanocrystal (or the core). The thickness of the shell or the second semiconductor nanocrystal may be about 2 times or less, about 1.5 times or less, about 1.2 times or less, about 1 time or less, about 0.8 times or less, about 0.7 times or less, about 0.6 times or less, about 0.5 times or less, about 0.4 times or less, about 0.35 times or less of a diameter of the first semiconductor nanocrystal (or the core).

The first semiconductor nanocrystal or the core (hereinafter, can be simply referred to as "the first semiconductor nanocrystal") may include silver, a Group 13 metal (e.g., indium, gallium, or a combination thereof), and a chalcogen element (e.g., sulfur, and optionally selenium). The first semiconductor nanocrystal may include a ternary alloy semiconductor material based on a Group 11-13-16 compound including silver (Ag), indium, and sulfur. The first semiconductor nanocrystal may not substantially include gallium.

The present inventors have found that a silver-indium-sulfur based semiconductor nanocrystal may not emit green light with a desired optical property. However, the present inventors have surprisingly found that by incorporating the feature described herein, the semiconductor nanoparticle of an embodiment may emit a light of a desired wavelength and may exhibit a narrow full width at half maximum with an improved luminous efficiency. The second semiconductor nanocrystal or the shell (hereinafter, can be simply referred to as "the shell") may have a different composition from the first semiconductor nanocrystal. The shell may include a Group 13 metal (indium, gallium, or a combination thereof), and a chalcogen element (sulfur, and optionally selenium). The shell may further include a Group 11 metal such as silver (Ag). The shell may include gallium, sulfur, and optionally silver. The shell may include a ternary alloy semiconductor material including silver, gallium, and sulfur. The shell may include a gallium sulfide. The shell may include a Group 13-16 compound, a Group 11-13-16 compound, or a combination thereof. The Group 13-16 compound may include gallium sulfide, gallium selenide, indium sulfide, indium selenide, indium gallium sulfide, indium gallium selenide, indium gallium selenide sulfide, or a combination thereof. A bandgap energy of the shell may be different from that of the first semiconductor nanocrystal. The shell may cover at least a portion of the first semiconductor nanocrystal.

A bandgap energy of the shell may be greater than a bandgap energy of the first semiconductor nanocrystal. A bandgap energy of the shell may be less than a bandgap energy of the first semiconductor nanocrystal.

The molar ratios between each component in the second semiconductor nanocrystal may be adjusted so that the final nanoparticles exhibit a desired composition and optical properties.

The second semiconductor nanocrystal or the first semiconductor nanocrystal may exhibit crystallinity when confirmed by, for example, an appropriate analytical means (e.g., an X-ray diffraction analysis, an electron microscope analysis such as high angle annular dark field (HAADF)-scanning transmission electron microscope (STEM) analysis, etc.). In an embodiment, the first semiconductor nanocrystal or the second semiconductor nanocrystal may be, for example, amorphous when confirmed by an appropriate analysis means.

A size (or an average size, hereinafter, "size") of the semiconductor nanoparticle may be greater than or equal to about 1 nm, greater than or equal to about 1.5 nm, greater than or equal to about 2 nm, greater than or equal to about 2.5 nm, greater than or equal to about 3 nm, greater than or equal to about 3.5 nm, greater than or equal to about 4 nm, greater than or equal to about 4.5 nm, greater than or equal to about 5 nm, greater than or equal to about 5.5 nm, greater than or equal to about 6 nm, greater than or equal to about 6.5 nm, greater than or equal to about 7 nm, greater than or equal to about 7.5 nm, greater than or equal to about 8 nm, greater than or equal to about 8.5 nm, greater than or equal to about 9 nm, greater than or equal to about 9.5 nm, greater than or equal to about 10 nm, or greater than or equal to about 10.5 nm. The size of the semiconductor nanoparticle may be less than or equal to about 50 nm, less than or equal to about 48 nm, less than or equal to about 46 nm, less than or equal to about 44 nm, less than or equal to about 42 nm, less than or equal to about 40 nm, less than or equal to about 35 nm, less than or equal to about 30 nm, less than or equal to about 25 nm, less than or equal to about 20 nm, less than or equal to about 18 nm, less than or equal to about 16 nm, less than or equal to about 14 nm, less than or equal to about 12 nm, less than or equal to about 11 nm, less than or equal to about 10 nm, less than or equal to about 8 nm, less than or equal to about 6 nm, or less than or equal to about 4 nm.

As used herein, the size of the semiconductor nanoparticle may be a particle diameter. The size of the semiconductor nanoparticle may be an equivalent diameter thereof that is obtained by a calculation involving a conversion of a two-dimensional area of a transmission electron microscopy image of a given particle into a circle. The size may be a value (e.g., nominal particle size) calculated from a composition and an emission peak wavelength of the semiconductor nanoparticle.

The semiconductor nanoparticle of an embodiment may be configured to emit a desired light (e.g., a green light) while exhibiting improved properties.

An emission peak wavelength of the green light or an emission peak wavelength of the semiconductor nanoparticle may be greater than or equal to about 500 nm, greater than or equal to about 505 nm, greater than or equal to about 510 nm, greater than or equal to about 515 nm, greater than or equal to about 520 nm, greater than or equal to about 525 nm, greater than or equal to about 530 nm, greater than or equal to about 535 nm, greater than or equal to about 540 nm, greater than or equal to about 545 nm, greater than or equal to about 550 nm, greater than or equal to about 555 nm, greater than or equal to about 560 nm, greater than or equal to about 565 nm, greater than or equal to about 570 nm, greater than or equal to about 575 nm, greater than or equal to about 580 nm, greater than or equal to about 585 nm, or greater than or equal to about 590 nm. The emission peak wavelength of the green light or the semiconductor nanoparticle may be less than or equal to about 580 nm, less than or equal to about 575 nm, less than or equal to about 570 nm, less than or equal to about 565 nm, less than or equal to about 560 nm, less than or equal to about 555 nm, less than or equal to about 550 nm, less than or equal to about 545 nm, less than or equal to about 540 nm, less than or equal to about 535 nm, less than or equal to about 530 nm, less than or equal to about 525 nm, less than or equal to about 520 nm, or less than or equal to about 515 nm.

A full width at half maximum (FWHM) of the green light or the semiconductor nanoparticle may be greater than or equal to about 5 nm, greater than or equal to about 10 nm, greater than or equal to about 15 nm, greater than or equal to about 20 nm, greater than or equal to about 25 nm, or greater than or equal to about 30 nm. The full width at half maximum may be less than or equal to about 70 nm, less than or equal to about 65 nm, less than or equal to about 60 nm, less than or equal to about 55 nm, less than or equal to about 50 nm, less than or equal to about 45 nm, less than or equal to about 40 nm, less than or equal to about 38 nm, less than or equal to about 36 nm, less than or equal to about 35 nm, less than or equal to about 34 nm, less than or equal to about 33 nm, less than or equal to about 32 nm, less than or equal to about 31 nm, less than or equal to about 30 nm, less than or equal to about 29 nm, less than or equal to about 28 nm, less than or equal to about 27 nm, less than or equal to about 26 nm, less than or equal to about 25 nm.

The semiconductor nanoparticle may exhibit a quantum yield of greater than or equal to about 50%. The quantum yield may be an absolute quantum yield. The quantum yield may be greater than or equal to about 55%, greater than or equal to about 60%, greater than or equal to about 65%, greater than or equal to about 70%, greater than or equal to about 75%, greater than or equal to about 80%, greater than or equal to about 85%, greater than or equal to about 90%, or greater than or equal to about 95%. The quantum yield may be less than or equal to about 100%, less than or equal to about 99.5%, less than or equal to about 99%, less than or equal to about 98%, or less than or equal to about 97%.

The green light may include band-edge emission. In an embodiment, the light emitted by the semiconductor nanoparticle may further include a defect site emission or a trap emission. The band-edge emission may be centered at a higher energy (a lower wavelength) with a smaller offset from the absorption onset energy compared to the trap emission. The band-edge emission may have a narrower wavelength distribution than the trap emission. The band-edge emission may have a normal (e.g., Gaussian) wavelength distribution.

A difference between the band-edge emission peak wavelength and the trap emission peak wavelength may be, for example, greater than or equal to about 80 nm, greater than or equal to about 90 nm, or greater than or equal to about 100 nm.

In an embodiment, at least 90% of the emission of the semiconductor nanoparticle may represent band-edge emission. A percentage of a band-edge emission may be calculated by fitting the Gaussian peaks (e.g., two or more) of the emission spectrum of the semiconductor nanoparticle and comparing an area of the peak closer in energy to the bandgap of the semiconductor nanoparticle (representing the band-edge emission) with respect to the sum of all peak areas (e.g., the sum of band-edge emission and trap emission).

The percentage of the band-edge emission may be greater than or equal to about 95%, greater than or equal to about 95.5%, greater than or equal to about 96%, greater than or equal to about 96.5%, greater than or equal to about 97%, greater than or equal to about 97.5%, greater than or equal to about 98%, greater than or equal to about 98.5%, greater than or equal to about 99%, or greater than or equal to about 99.5%. The semiconductor nanoparticle of an embodiment may have a band-edge emission percentage of substantially 100%.

In the photoluminescence spectrum of the semiconductor nanoparticle, a ratio of an area of the tail emission peak (e.g., a peak portion in a range of the emission peak wavelength plus at least about 70 nm or longer, at least about 80 nm or longer, at least about 90 nm longer, or at least about 100 nm or longer) to a total area of the emission peak may be less than or equal to about 20%, less than or equal to about 15%, less than or equal to about 12%, less than or equal to about 10%, less than or equal to about 9%, less than or equal to about 8%, less than or equal to about 7%, less than or equal to about 6%, less than or equal to about 5%, less than or equal to about 4%, less than or equal to about 3%, or less than or equal to about 2%.

In the photoluminescence spectrum of the semiconductor nanoparticle, a relative light emission intensity defined by the following equation may be greater than about 20, or greater than or equal to about 25:

$$\text{relative light emission intensity} = A1/A2$$

wherein, A1 is an intensity of the spectrum at the emission peak wavelength, and A2 is a maximum intensity of the spectrum in a tail emission wavelength range of the emission peak wavelength plus greater than or equal to about 80 nm (or greater than or equal to about 85 nm, greater than or equal to about 90 nm, greater than or equal to about 95 nm, or greater than or equal to 100 nm. An upper limit of the trap emission wavelength range may be a wavelength at which an intensity of the spectrum becomes substantially zero.

Without wishing to be bound by any theory, in the above equation, A1 may represent the band-edge emission and A2 may be substantially related to the trap emission.

The present inventors have found that it may be difficult to suppress or remove a trap emission in the semiconductor nanoparticle including a Group 13-16 compound with silver prepared by a conventional method. The present inventors, however, have surprisingly found that the semiconductor nanoparticle of an embodiment prepared by the method described herein may exhibit an emission spectrum in which the trap emission is substantially suppressed or removed.

Accordingly, in an embodiment, a relative light emission intensity of the semiconductor nanoparticle may be from about 21 to about 100, from about 21.5 to about 80, from about 22 to about 75, from about 22.5 to about 70, from about 23 to about 65, from about 23.5 to about 60, from about 24 to about 55, from about 24.5 to about 50, from about 25 to about 45, from about 25.5 to about 40, from about 26 to about 35, from about 26.5 to about 30, or a combination thereof.

In an embodiment, a method of producing the semiconductor nanoparticle includes obtaining the first semiconductor nanocrystal (or the core) including silver, indium, and sulfur;

preparing a reaction medium including a first precursor and an organic ligand in an organic solvent;

heating the reaction medium to a first temperature;

adding the first semiconductor nanocrystal and a second precursor to the heated reaction medium, wherein if the first precursor is a gallium precursor then the second precursor is a sulfur precursor, or if the first precursor is a sulfur precursor then the second precursor is a gallium precursor; and heating the reaction medium to a second temperature for a first duration to form the semiconductor nanoparticle, wherein the first temperature is greater than or equal to about 120° C. (e.g., greater than or equal to about 180° C.) and less than or equal to about 280° C. and the second temperature is greater than or equal to about 240° C. and less than or equal to about 380° C.

The reaction may include a reaction between the first precursor and the second precursor in the presence of the first semiconductor nanocrystal, thereby providing the second semiconductor nanocrystal on a surface of the first semiconductor nanocrystal.

In an embodiment, the first precursor may be a gallium precursor, and the second precursor may be a sulfur precursor. In an embodiment, the first precursor may be a sulfur precursor, and the second precursor may be a gallium precursor.

In an embodiment, the method may further include preparing an additional reaction medium including an organic ligand and a zinc precursor in an organic solvent; heating the additional reaction medium to a reaction temperature; adding the semiconductor nanoparticle formed above and a chalcogen precursor to conduct a reaction and to provide the outer layer including the zinc chalcogenide on the semiconductor nanoparticle. The chalcogen precursor may include a sulfur precursor, a selenium precursor, or a combination thereof. Details of the reaction temperature are the same as described for the second temperature.

Details of the first semiconductor nanocrystal or the core are the same as described herein. In an embodiment, a method of producing the first semiconductor nanocrystal may be obtained by reacting required precursors depending on the composition, such as a silver precursor, an indium precursor, and a sulfur precursor in a solution including an organic ligand and an organic solvent at a predetermined reaction temperature (e.g., about 100° C. to about 300° C., about 120° C. to about 280° C., about 140° C. to about 250° C., or a combination thereof) and separating the same. In an embodiment, preparation of the first semiconductor nanocrystal may include heating the organic ligand and the organic solvent under vacuum to obtain a reaction medium and adding the required precursors to the reaction medium to conduct a reaction therebetween. In the preparation of the first semiconductor nanocrystal, types and mole ratios among the required precursors may be controlled to obtain a desired composition of the first semiconductor nanocrystal, taking into consideration a reactivity and a reaction condition such as a reaction duration or a reaction temperature.

In an embodiment, an added mole amount (or mole equivalent) of an indium precursor may be, per one mole of silver, greater than or equal to about 1 mole, greater than or equal to about 1.5 moles, greater than or equal to about 2 moles, greater than or equal to about 2.5 moles, greater than or equal to about 3 moles, greater than or equal to about 3.5 moles, greater than or equal to about 4 moles, greater than or equal to about 4.5 moles, greater than or equal to about 5 moles, greater than or equal to about 5.5 moles, greater than or equal to about 6 moles, greater than or equal to about 6.5 moles, greater than or equal to about 7 moles, or greater than or equal to about 7.5 moles. In an embodiment, an added mole amount (or mole equivalent) of an indium precursor may be, per one mole of silver, less than or equal to about 20 moles, less than or equal to about 15 moles, less than or equal to about 13 moles, less than or equal to about 12 moles, less than or equal to about 10 moles, less than or equal to about 9 moles, less than or equal to about 8 moles, or less than or equal to about 7 moles.

In an embodiment, an added mole amount of a sulfur precursor may be, per one mole of silver, greater than or equal to about 2 moles, greater than or equal to about 3 moles, greater than or equal to about 4 moles, greater than or equal to about 5 moles, greater than or equal to about 6 moles, greater than or equal to about 7 moles, greater than or equal to about 8 moles, greater than or equal to about 9 moles, or greater than or equal to about 10 moles. In an embodiment, an added mole amount of a sulfur precursor may be, per one mole of silver, less than or equal to about 30 moles, less than or equal to about 20 moles, less than or equal to about 17 moles, less than or equal to about 15 moles, less than or equal to about 12 moles, less than or equal to about 11 moles, less than or equal to about 10 moles, or less than or equal to about 5 moles. For separation and recovery of the first semiconductor nanocrystal, a method to be described herein may be referred to.

In an embodiment, the second temperature may be greater than the first temperature. A difference between the first temperature and the second temperature may be greater than or equal to about 10° C., greater than or equal to about 20° C., greater than or equal to about 30° C., greater than or equal to about 40° C., greater than or equal to about 50° C., greater than or equal to about 60° C., greater than or equal to about 70° C., greater than or equal to about 80° C., greater than or equal to about 90° C., or greater than or equal to about 100° C. The difference between the first temperature and the second temperature may be less than or equal to about 200° C., less than or equal to about 190° C., less than or equal to about 180° C., less than or equal to about 170° C., less than or equal to about 160° C., less than or equal to about 150° C., less than or equal to about 140° C., less than or equal to about 130° C., less than or equal to about 120° C., less than or equal to about 110° C., less than or equal to about 100° C., less than or equal to about 90° C., less than or equal to about 80° C., less than or equal to about 70° C., less than or equal to about 60° C., less than or equal to about 50° C., less than or equal to about 40° C., less than or equal to about 30° C., or less than or equal to about 20° C.

The first temperature may be greater than or equal to about 150° C., greater than or equal to about 190° C., greater than or equal to about 200° C., greater than or equal to about 210° C., greater than or equal to about 220° C., greater than or equal to about 230° C., greater than or equal to about 240° C., or greater than or equal to about 250° C. The first temperature may be less than or equal to about 280° C., less than or equal to about 275° C., less than or equal to about 270° C., less than or equal to about 265° C., less than or equal to about 260° C., less than or equal to about 255° C., less than or equal to about 250° C., less than or equal to about 240° C., less than or equal to about 230° C., less than or equal to about 220° C., less than or equal to about 210° C., less than or equal to about 200° C., less than or equal to about 190° C., less than or equal to about 180° C., less than or equal to about 170° C., less than or equal to about 160° C., or less than or equal to about 150° C.

The second temperature may be greater than or equal to about 240° C., greater than or equal to about 245° C., greater than or equal to about 250° C., greater than or equal to about 255° C., greater than or equal to about 260° C., greater than or equal to about 265° C., greater than or equal to about 270° C., greater than or equal to about 275° C., greater than or equal to about 280° C., greater than or equal to about 285° C., greater than or equal to about 290° C., greater than or equal to about 295° C., greater than or equal to about 300° C., greater than or equal to about 305° C., greater than or equal to about 310° C., greater than or equal to about 315° C., greater than or equal to about 320° C., greater than or equal to about 330° C., greater than or equal to about 335° C., greater than or equal to about 340° C., or greater than or equal to about 345° C. The second temperature may be less than or equal to about 380° C., less than or equal to about 375° C., less than or equal to about 370° C., less than or equal to about 365° C., less than or equal to about 360° C., less than or equal to about 355° C., less than or equal to about 350° C., less than or equal to about 340° C., less than or equal to about 330° C., less than or equal to about 320° C., less than or equal to about 310° C., less than or equal to about 300° C., less than or equal to about 290° C., less than or equal to about 280° C., less than or equal to about 270° C., less than or equal to about 260° C., or less than or equal to about 250° C.

The first duration (or time of reaction at the second temperature) may be controlled to obtain a charge balance value of the semiconductor nanoparticle. Without wishing to be bound by any theory, it is believed that by controlling the first temperature and the second temperature and the first duration in the aforementioned reaction, generation of side reaction products (e.g., gallium oxide) may be effectively suppressed during the formation of a semiconductor nanoparticle. The result of which is that the final semiconductor nanoparticle may have a charge balance value described herein (optionally together with the molar ratios described herein) that contributes to achieving the improved properties of the semiconductor nanoparticle.

In an embodiment, the first duration may be in a range of about 1 minute to about 200 minutes, about 10 minutes to about 3 hours, about 20 minutes to about 150 minutes, or about 30 minutes to about 100 minutes. The first duration may be selected taking into consideration the types of precursors, the reaction temperature, the desired composition of the final particles, or the like.

In an embodiment, the second reaction temperature may be within a relatively higher temperature range (e.g., greater than or equal to about 250° C., greater than or equal to about 260° C., greater than or equal to about 270° C., greater than or equal to about 280° C., or from about 285° C. to about 340° C. or from about 290° C. to about 330° C.). The first duration may be greater than or equal to about 1 minute, greater than or equal to about 5 minutes, greater than or equal to about 10 minutes, greater than or equal to about 15 minutes, greater than or equal to about 20 minutes, or greater than or equal to about 25 minutes and less than or equal to about 2 hours, less than or equal to about 90 minutes, less than or equal to about 80 minutes, less than or equal to about 70 minutes, less than or equal to about 60 minutes, less than or equal to about 50 minutes, less than or equal to about 45 minutes, less than or equal to about 40 minutes, or less than or equal to about 35 minutes.

In an embodiment, the second reaction temperature may be within a relatively lower temperature range (e.g., less than about 290° C., less than or equal to about 280° C., less than or equal to about 270° C., less than or equal to about 260° C., less than or equal to about 250° C., less than or equal to about 240° C., less than or equal to about 230° C., less than or equal to about 220° C., or less than or equal to about 210° C.). The first reaction time may be greater than or equal to about 30 minutes, greater than or equal to about 35 minutes, greater than or equal to about 40 minutes, greater than or equal to about 45 minutes, greater than or equal to about 50 minutes, greater than or equal to about 55 minutes, greater than or equal to about 60 minutes, greater than or equal to about 65 minutes, greater than or equal to about 70 minutes, greater than or equal to about 75 minutes, or greater than or equal to about 80 minutes.

A type of the silver precursor is not particularly limited. The silver precursor may include a silver powder, an alkylated silver compound, a silver alkoxide, a silver carboxylate, a silver acetylacetonate, a silver nitrate, a silver sulfate, a silver halide, a silver cyanide, a silver hydroxide, a silver oxide, a silver peroxide, a silver carbonate, or a combination thereof. The silver precursor may include a silver nitrate, a silver acetate, a silver acetylacetonate, a silver chloride, a silver bromide, a silver iodide, or a combination thereof.

A type of the indium precursor is not particularly limited. The indium precursor may include an indium powder, an alkylated indium compound, an indium alkoxide, an indium carboxylate, an indium nitrate, an indium perchlorate, an indium sulfate, an indium acetylacetonate, an indium halide, an indium cyanide, an indium hydroxide, an indium oxide, an indium peroxide, an indium carbonate, an indium acetate, or a combination thereof. The indium precursor may include an indium carboxylate such as indium oleate and indium myristate, an indium acetate, an indium hydroxide, an indium chloride, an indium bromide, an indium iodide, or a combination thereof.

A type of the gallium precursor is not particularly limited. The gallium precursor may include a gallium powder, an alkylated gallium compound, a gallium alkoxide, a gallium carboxylate, a gallium nitrate, a gallium perchlorate, a gallium sulfate, a gallium acetylacetonate, a gallium halide, a gallium cyanide, a gallium hydroxide, a gallium oxide, a gallium peroxide, a gallium carbonate, or a combination thereof. The gallium precursor may include a gallium chloride, a gallium iodide, a gallium bromide, a gallium acetate, a gallium acetylacetonate, a gallium oleate, a gallium palmitate, a gallium stearate, a gallium myristate, a gallium hydroxide, or a combination thereof.

A type of the sulfur precursor is not particularly limited. The sulfur precursor may be an organic solvent dispersion or a reaction product of sulfur and an organic solvent, for example, a octadecene sulfide (S-ODE), a trioctylphosphine-sulfide (S-TOP), a tributylphosphine-sulfide (S-TBP), a triphenylphosphine-sulfide (S-TPP), or a trioctylamine-sulfide (S-TOA), a bistrimethylsilylalkyl sulfide, a bistrimethylsilyl sulfide, a mercapto propyl silane, an ammonium sulfide, a sodium sulfide, a C1-30 thiol compound (e.g., α-toluene thiol, octane thiol, dodecanethiol, octadecene thiol, etc.), an isothiocyanate compound (e.g., cyclohexylisothiocyanate), an alkylenetrithiocarbonate (e.g., ethylene trithiocarbonate), allyl mercaptan, a thiourea compound (e.g., (di)alkylthiourea having a C1 to C40 alkyl group, for example, methyl thiourea, dimethyl thiourea, ethyl thiourea, diethyl thiourea, ethyl methyl thiourea, dipropyl thiourea, etc.; or an arylthiourea such as a phenyl thiourea), or a combination thereof.

The selenium precursor, if present, may include selenium-trioctylphosphine (Se-TOP), selenium-tributylphosphine (Se-TBP), selenium-triphenylphosphine (Se-TPP), or a combination thereof.

A type of the zinc precursor is not particularly limited. In an embodiment, the zinc precursor may include a Zn metal powder, an alkylated Zn compound, a Zn alkoxide, a Zn carbon/late, a Zn nitrate, a Zn perchlorate, a Zn sulfate, a Zn acetylacetonate, a Zn halide, a Zn cyanide, a Zn hydroxide, a Zn oxide, a Zn peroxide, or a combination thereof. The zinc precursor may be dimethyl zinc, diethyl zinc, zinc acetate, zinc acetylacetonate, zinc iodide, zinc bromide, zinc chloride, zinc fluoride, zinc carbonate, zinc cyanide, zinc nitrate, zinc oxide, zinc peroxide, zinc perchlorate, zinc sulfate, or a combination thereof.

The organic ligand may include $RCOOH$, $RNH_2$, $R_2NH$, $R_3N$, $RSH$, $RH_2PO$, $R_2HPO$, $R_3PO$, $RH_2P$, $R_2HP$, $R_3P$, $ROH$, $RCOOR'$, $RPO(OH)_2$, $RHPOOH$, $RHPOOH$ (wherein, R and R' are each independently substituted or unsubstituted C1 to C40 (or C3 to C24) aliphatic hydrocarbon (e.g., alkyl group, alkenyl group alkynyl group), or a substituted or unsubstituted C6 to C40 (or C6 to C24) aromatic hydrocarbon (e.g., C6 to C20 aryl group)), or a combination thereof. The organic ligand may be bound to the surface of the nanoparticles. Examples of the organic ligand may include methane thiol, ethane thiol, propane thiol, butane thiol, pentane thiol, hexane thiol, heptane thiol, octane thiol, nonanethiol, decanethiol, dodecane thiol, hexadecane thiol, octadecane thiol, benzyl thiol; methyl amine, ethyl amine, propyl amine, butyl amine, pentyl amine, hexyl amine, octyl amine, dodecyl amine, hexadecyl amine, octadecyl amine, dimethyl amine, diethyl amine, dipropyl amine; methanoic acid, ethanoic acid, propanoic acid, butanoic acid, pentanoic acid, hexanoic acid, heptanoic acid, octanoic acid, dodecanoic acid, hexadecanoic acid, octadecanoic acid, oleic acid, benzoic acid; substituted or unsubstituted methyl phosphine (e.g., trimethyl phosphine, methyldiphenyl phosphine, etc.), substituted or unsubstituted ethyl phosphine (e.g., triethyl phosphine, ethyldiphenyl phosphine, etc.), substituted or unsubstituted propyl phosphine, substituted or unsubstituted butyl phosphine, substituted or unsubstituted pentyl phosphine, substituted or unsubstituted octylphosphine (e.g., trioctylphosphine (TOP)), and the like phosphine; phosphine oxide such as substituted or unsubstituted methyl phosphine oxide (e.g., trimethyl phosphine oxide, methyldiphenyl phosphineoxide, etc.), substituted or unsubstituted ethyl phosphine oxide (e.g., triethyl phosphine oxide, ethyldiphenyl phosphineoxide, etc.), substituted or unsubstituted propyl phosphine oxide, substituted or unsubstituted butyl phosphine oxide, substituted or unsubstituted octyl phosphineoxide (e.g., trioctyl phosphineoxide (TOPO), etc.; diphenyl phosphine, a triphenyl phosphine compound, or an oxide compound thereof; C5 to C20 alkylphosphinic acid or C5 to C20 alkyl phosphonic acid such as phosphonic acid, hexylphosphinic acid, octylphosphinic acid, dodecanephosphinic acid, tetradecanephosphinic acid, hexadecanephosphinic acid, octadecanephosphinic acid, etc.; and the like, but is not limited thereto. The organic ligand may be used alone or as a mixture of two or more.

The organic solvent may include an amine solvent, a nitrogen-containing heterocyclic compound such as pyridine; C6 to C40 aliphatic hydrocarbon (e.g., alkane, alkene, alkyne, etc.) such as hexadecane, octadecane, octadecene, or squalane; C6 to C30 aromatic hydrocarbon such as phenyldodecane, phenyltetradecane, or phenyl hexadecane; phosphine substituted with a C6 to C22 alkyl group such as trioctylphosphine; phosphine oxide substituted with a C6 to C22 alkyl group such as trioctylphosphine oxide, and the like; C12 to C22 aromatic ether such as phenyl ether, or benzyl ether, or a combination thereof. The amine solvent may be a compound having one or more (e.g., two or three) C1-50, C2-45, C3-40, C4-35, C5-30, C6-25, C7-20, C8-15, or C6-22 aliphatic hydrocarbon groups (alkyl group, alkenyl group, or an alkynyl group). In an embodiment, the amine solvent may be a C6-22 primary amine such as hexadecyl amine and oleyl amine; secondary amines of C6-22 such as dioctyl amine; C6-22 tertiary amines such as trioctylamine; or a combination thereof.

Amounts of the organic ligand and the precursors in the reaction medium may be selected appropriately in consideration of the type of solvent, the type of the organic ligand and each precursor, and the size and composition of desired particles. The mole ratios between the precursors described herein may be varied taking into consideration the desired elemental mole ratios of the final nanoparticle, the reactivities among the precursors, or the like. In an embodiment, a manner of adding each of the precursors is not particularly limited. In an embodiment, a total amount of a precursor may be added at one time, or a total amount of a precursor may be divided, and separately added to the reaction medium in greater than or equal to 2 aliquots (or portions) and less than or equal to 10 aliquots. The precursors may be added simultaneously or sequentially in a predetermined order. The reaction may be carried out in an inert gas atmosphere, in air, or under vacuum, but is not limited thereto.

In an embodiment, after the completion of the reaction, a nonsolvent may be added to a final reaction solution to facilitate precipitation of a semiconductor nanoparticle (for example, with a coordinating organic ligand). The nonsolvent may be a polar solvent that is miscible with the solvent used in the reaction but is less efficient in dispersing or dissolution of the nanocrystals. The nonsolvent may be selected depending on the solvent used in the reaction and may be for example, acetone, ethanol, butanol, isopropanol, ethanediol, water, tetrahydrofuran (THF), dimethylsulfoxide (DMSO), diethylether, formaldehyde, acetaldehyde, a solvent having a similar solubility parameter to the foregoing solvents, or a combination thereof. The separation of the nanocrystals or nanoparticles may be performed by centrifugation, precipitation, chromatography, or distillation. Separated nanocrystals may be washed by adding to a washing solvent as needed. The washing solvent is not particularly limited, and a solvent having a solubility parameter similar to that of the organic solvent or ligand may be used. The nonsolvent or washing solvent may be alcohols; alkane solvents such as hexane, heptane, or octane; aromatic solvents such as chloroform; toluene, or benzene; or a combination thereof, but is not limited thereto.

The semiconductor nanoparticle thus prepared may be dispersed in a dispersion solvent. The semiconductor nanoparticle thus prepared may form an organic solvent dispersion. The organic solvent dispersion may not include water and/or an organic solvent miscible with water. The dispersion solvent may be appropriately selected. The dispersion solvent may include the aforementioned organic solvent. The dispersion solvent may include a substituted or unsubstituted C1 to C40 aliphatic hydrocarbon, a substituted or unsubstituted C6 to C40 aromatic hydrocarbon, or a combination thereof.

A shape of the semiconductor nanoparticle thus prepared is not particularly limited, and may include, for example, spherical, polyhedral, pyramidal, multi-pod, cubic, nanotubes, nanowires, nanofibers, nanosheets, or a combination thereof, but is not limited thereto.

The semiconductor nanoparticle of an embodiment may include an organic ligand and/or an organic solvent on a surface of the semiconductor nanoparticle. The organic ligand and/or the organic solvent may be bound to a surface of the semiconductor nanoparticle of an embodiment.

In an embodiment, a composite may include a matrix; and the semiconductor nanoparticle described herein, wherein the semiconductor nanoparticles are dispersed in the matrix. The semiconductor nanoparticles described herein or the composite including the semiconductor nanoparticles may exhibit an increased level of blue light absorbance (e.g., an improved incident light absorbance) and improved optical properties (e.g., an increased luminous efficiency and/or a narrower full width at half maximum) and may emit light of a desired wavelength (e.g., a first light). In an embodiment, the composite may have a sheet form. In an embodiment, the composite may be in the form of a patterned film.

The composite may include the semiconductor nanoparticle or a population thereof (e.g., in a predetermined amount), exhibiting increased incident light absorbance. An incident light absorbance of the composite may be greater than or equal to about 70%, greater than or equal to about 73%, greater than or equal to about 75%, greater than or equal to about 77%, greater than or equal to about 80%, greater than or equal to about 83%, greater than or equal to about 85%, greater than or equal to about 87%, greater than or equal to about 90%, greater than or equal to about 93%, greater than or equal to about 94%, greater than or equal to about 95%, greater than or equal to about 96%, greater than or equal to about 97%, greater than or equal to about 98%, or greater than or equal to about 99%. The incident light absorbance of the composite may be about 70% to 100%, about 80% to about 98%, about 95% to about 99%, about 96% to about 98%, or a combination thereof.

The incident light absorbance may be defined as below:

$$\text{incident light absorbance} = (B-B')/B \times 100(\%)$$

wherein, B is an amount of incident light (e.g., blue light), and

B' is an amount of incident light passing through the composite.

In an embodiment, a color conversion layer (e.g., a color conversion structure) may include the semiconductor nanoparticle described herein. In an embodiment, a color conversion panel include the conversion layer. The color conversion layer may include a (or at least two) color conversion region(s). The color conversion layer (or the color conversion structure) may include the composite of an embodiment or a patterned film of the composite. In an embodiment, a first optical filter (e.g., an incident light blocking element or an absorption type color filter) may be provided on a surface of the color conversion panel.

Figure 1B:
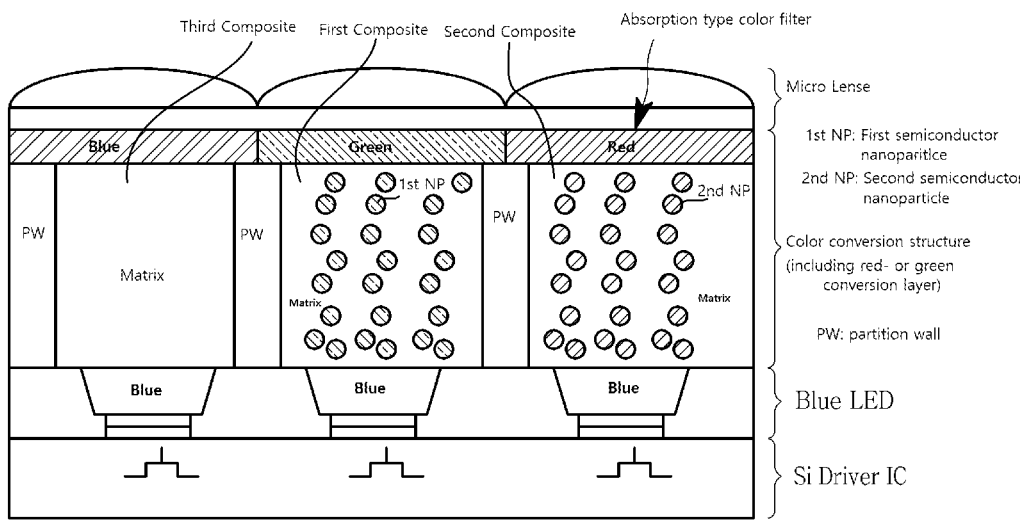
FIG. 1B is a cross-sectional representation of an electronic device (display device) including a color conversion panel according to a non-limiting embodiment.

FIG. 1A is a schematic cross-sectional view of a color conversion panel according to an embodiment. Referring to FIG. 1A, the color conversion panel may optionally further include a partition wall (e.g., a black matrix (BM), a bank, or a combination thereof) that defines each color conversion region of the color conversion layer (e.g., a color conversion structure). FIG. 1B illustrates an electronic device (a display device) including a light source 10 and a color conversion layer (or a color conversion structure) 20 that includes for example a partition wall or a trench type partition wall according to an embodiment. A partition wall (pw) may include an inorganic material such as silicon or silicon oxide, an organic material such as a polymer or a pigment, or a combination thereof. A dimension and a cross-sectional shape of the partition wall are not particularly limited and may be selected appropriately.

In FIG. 1B, an absorption type color filter may be disposed on one side (e.g., a light extraction surface) of the color conversion panel 20 and a microLED or a blue LED may be disposed on the opposite side of the color conversion panel 20. The color conversion panel 20 may be disposed on an LED on chip (e.g., a micro LED on chip). An optical film may be disposed on the color conversion panel. The optical film may include a micro lens 30.

Referring to FIG. 1B, a circuit (Si driver IC) configured to drive the light source may be disposed under a light source (e.g., blue LED) configured to emit incident light (e.g., blue light). The color conversion layer may include a first composite including a first semiconductor nanoparticle $1^{st}$ NP emitting a first light (e.g., green light), and a second composite including a semiconductor nanoparticle $2^{nd}$ NP emitting a second light (e.g., red light), or a third composite that emits or passes a third light (e.g., incident light or blue light). The partition wall may include a trench hole, a via hole, or a combination thereof.

The color conversion region includes a first region configured to emit the first light (or green light) (e.g., by irradiation with an incident light). In an embodiment, the first region may correspond to a green pixel. The first region includes a first composite (e.g., a luminescence type composite). The first light may have an emission peak wavelength within a wavelength range to be described later. The emission peak wavelength of the green light may be greater than or equal to about 500 nm, greater than or equal to about 501 nm, greater than or equal to about 504 nm, greater than or equal to about 505 nm, or greater than or equal to about 520 nm. The emission peak wavelength of the green light may be less than or equal to about 580 nm, less than or equal to about 560 nm, less than or equal to about 550 nm, less than or equal to about 530 nm, less than or equal to about 525 nm, less than or equal to about 520 nm, less than or equal to about 515 nm, or less than or equal to about 510 nm.

The color conversion region may further include a (e.g., one or more) second region that is configured to emit a second light (e.g., red light) different from the first light (e.g., by irradiation with excitation light). The second region may include a second composite. The semiconductor nanoparticle composite in the second region may include a semiconductor nanoparticle (e.g., a quantum dot) configured to emit a light of a different wavelength (e.g., a different color) from the semiconductor nanoparticle composite disposed in the first region.

The second light may be red light having an emission peak wavelength of about 600 nm to about 650 nm (e.g., about 620 nm to about 650 nm). The color conversion panel may further include (one or more) third regions that emit or pass a third light (e.g., blue light) different from the first light and the second light. An incident light may include the third light (e.g., blue light) and optionally green light).

The third light may include a blue light having a emission peak wavelength of greater than or equal to about 380 nm (e.g., greater than or equal to about 440 nm, greater than or equal to about 445 nm, greater than or equal to about 450 nm, or greater than or equal to about 455 nm) and less than or equal to about 480 nm (less than or equal to about 475 nm, less than or equal to about 470 nm, less than or equal to about 465 nm, or less than or equal to about 460 nm).

In an embodiment, a color conversion panel includes a color conversion layer or a color conversion structure that includes a color conversion region including a first region. The composite of the embodiment may be disposed in the first region. The color conversion region may include a plurality of the first regions disposed in a predetermined pattern, each of the first regions may include the composite of the embodiment. The composite (or a pattern thereof) may be prepared from an (ink) composition by any method, for example, in a photolithography manner or in an inkjet printing manner. Accordingly, an embodiment also relates to an ink composition including a liquid vehicle and the semiconductor nanoparticle described herein. The semiconductor nanoparticle may be dispersed in the liquid vehicle.

The liquid vehicle may include a liquid monomer, an organic solvent, or a combination thereof. The ink composition may further include a metal oxide fine particle, for example, dispersed in the liquid vehicle. The ink composition may further include a dispersant (for dispersing the semiconductor nanoparticles and/or the metal oxide fine particle). The dispersant may include a carboxylic acid group-containing organic compound (monomer or polymer). The liquid vehicle may not include an (e.g., volatile) organic solvent. The ink composition may be a solvent-free system.

The liquid monomer may include a (photo)polymerizable monomer including a carbon-carbon double bond. The composition may optionally further include a (thermal or photo) initiator. The polymerization of the composition may be initiated by light or heat.

Details of the semiconductor nanoparticle in the composition or in the composite are as described herein. An amount of the semiconductor nanoparticle in the composition or in the composite may be appropriately adjusted taking into consideration a desired end use (for example, a use as a luminescent type color filter). In an embodiment, an amount of the semiconductor nanoparticle in the composition (or composite) may be greater than or equal to about 1 weight percent (wt %), for example, greater than or equal to about 2 wt %, greater than or equal to about 3 wt %, greater than or equal to about 4 wt %, greater than or equal to about 5 wt %, greater than or equal to about 6 wt %, greater than or equal to about 7 wt %, greater than or equal to about 8 wt %, greater than or equal to about 9 wt %, greater than or equal to about 10 wt %, greater than or equal to about 15 wt %, greater than or equal to about 20 wt %, greater than or equal to about 25 wt %, greater than or equal to about 30 wt %, greater than or equal to about 35 wt %, or greater than or equal to about 40 wt % based on the solid content of the composition or composite (hereinafter, the solid content may be a solid content of the composition or a solid content of the composite). The amount of the semiconductor nanoparticle may be less than or equal to about 70 wt %, for example, less than or equal to about 65 wt %, less than or equal to about 60 wt %, less than or equal to about 55 wt %, or less than or equal to about 50 wt % based on the solid content. A weight percentage of a given component with respect to a total solid content in a composition may represent an amount of the given component in the composite described herein.

In an embodiment, an ink composition may be a semiconductor nanoparticle-containing photoresist composition that can be used in a photolithography process. In an embodiment, an ink composition may be a semiconductor nanoparticle-containing composition capable of providing a pattern in a printing process (e.g., a droplet discharging method such as an inkjet printing). The composition according to an embodiment may not include a conjugated (or conductive) polymer (except for a cardo binder to be described later). The composition according to an embodiment may include a conjugated polymer. In an embodiment, the conjugated polymer may include a polymer having a conjugated double bond in the main chain (e.g., polyphenylenevinylene, etc.).

In the composition according to an embodiment, the dispersant may ensure dispersibility of the semiconductor nanoparticle. In an embodiment, the dispersant may be a binder (or a binder polymer). The binder may include a carboxylic acid group (e.g., in the repeating unit). The binder may be an insulating polymer. The binder may be a carboxylic acid group-containing compound (monomer or polymer).

In the composition (or the composite), an amount of the dispersant may be greater than or equal to about 0.5 wt %, for example, greater than or equal to about 1 wt %, greater than or equal to about 5 wt %, greater than or equal to about 10 wt %, greater than or equal to about 15 wt %, or greater than or equal to about 20 wt % based on the total solid content of the composition (or composite). The amount of the dispersant may be less than or equal to about 55 wt %, less than or equal to about 35 wt %, less than or equal to about 33 wt %, or less than or equal to about 30 wt % based on the total solid content.

In the composition (or the liquid vehicle), a liquid monomer or a polymerizable (e.g., photopolymerizable) monomer (hereinafter, referred to as a monomer) including the carbon-carbon double bond may include a (e.g., photopolymerizable) (meth)acryl-based monomer. The monomer may be a precursor for an insulating polymer.

An amount of the monomer, based on a total weight of the composition, may be greater than or equal to about 0.5 wt %, for example, greater than or equal to about 1 wt %, greater than or equal to about 2 wt %, greater than or equal to about 3 wt %, greater than or equal to about 5 wt %, or greater than or equal to about 10 wt %. An amount of the photopolymerizable monomer, based on the total weight of the composition, may be less than or equal to about 30 wt %, for example, less than or equal to about 28 wt %, less than or equal to about 25 wt %, less than or equal to about 23 wt %, less than or equal to about 20 wt %, less than or equal to about 18 wt %, less than or equal to about 17 wt %, less than or equal to about 16 wt %, or less than or equal to about 15 wt %.

The (photo)initiator included in the composition may be used for (photo)polymerization of the aforementioned monomer. The initiator is a compound accelerating a radical reaction (e.g., radical polymerization of monomer) by producing radical chemical species under a mild condition (e.g., by heat or light). The initiator may be a thermal initiator or a photoinitiator. The initiator is not particularly limited and may be appropriately selected.

In the composition, an amount of the initiator may be appropriately adjusted considering types and contents of the polymerizable monomers. In an embodiment, The amount of the initiator may be greater than or equal to about 0.01 wt %, for example, greater than or equal to about 1 wt %, or greater than or equal to about and/or 10 wt %, and for example, less than or equal to about 9 wt %, less than or equal to about 8 wt %, less than or equal to about 7 wt %, less than or equal to about 6 wt %, or less than or equal to about 5 wt % based on the total weight of the composition (or the total weight of the solid content), but is not limited thereto.

The composition (or composite) may further include a (poly or monofunctional) thiol compound having at least one thiol group at the terminal end (or a moiety derived therefrom, such as a moiety produced by a reaction between a thiol and a carbon-carbon double bond, for example a sulfide group), metal oxide particulate, or a combination thereof.

The metal oxide fine particle may include $TiO_2$, $SiO_2$, $BaTiO_3$, $Ba_2TiO_4$, ZnO, or a combination thereof. In the composition (or composite), An amount of the metal oxide may be greater than or equal to about 1 wt %, greater than or equal to about 2 wt %, greater than or equal to about 3 wt %, greater than or equal to about 5 wt %, or greater than or equal to about 10 wt % and less than or equal to about 50 wt %, less than or equal to about 40 wt %, less than or equal to about 30 wt %, less than or equal to about 25 wt %, less than or equal to about 20 wt %, less than or equal to about 15 wt %, less than or equal to about 10 wt %, less than or equal to about 7 wt %, less than or equal to about 5 wt %, or less than or equal to about 3 wt % based on the total solids.

A diameter of the metal oxide fine particle is not particularly limited. The diameter of the metal oxide fine particle may be greater than or equal to about 100 nm, for example greater than or equal to about 150 nm, or greater than or equal to about 200 nm and less than or equal to about 1000 nm, or less than or equal to about 800 nm.

The polythiol compound may be a dithiol compound, a trithiol compound, a tetrathiol compound, or a combination thereof. For example, the thiol compound may be glycoldi- 3-mercaptopropionate, glycol dimercapto acetate, trimethylol propanetris(3-mercaptopropionate), pentaerythritol tetrakis(3-mercaptopropionate), pentaerythritol tetrakis(2-mercaptoacetate), 1,6-hexanedithiol, 1,3-propanedithiol, 1,2-ethanedithiol, polyethylene glycol dithiol including 1 to 10 ethylene glycol repeating units, or a combination thereof.

An amount of the thiol compound (or moieties derived therefrom) may be less than or equal to about 50 wt %, less than or equal to about 40 wt %, less than or equal to about 30 wt %, less than or equal to about 20 wt %, less than or equal to about 10 wt %, less than or equal to about 9 wt %, less than or equal to about 8 wt %, less than or equal to about 7 wt %, less than or equal to about 6 wt %, or less than or equal to about 5 wt % based on the total solids. The amount of the thiol compound may be greater than or equal to about 0.1 wt %, for example, greater than or equal to about 0.5 wt %, greater than or equal to about 1 wt %, greater than or equal to about 5 wt %, greater than or equal to about 10 wt %, greater than or equal to about 15 wt %, greater than or equal to about 18 wt %, or greater than or equal to about 20 wt % based on the total solids.

The composition or the liquid vehicle may include an organic solvent. The composition or the liquid vehicle may not include an organic solvent. If present, the type of solvent that may be used is not particularly limited. The type and amount of the organic solvent is appropriately determined in consideration of the types and amounts of the aforementioned main components (i.e., nanoparticles, dispersants, polymerizable monomers, initiators, thiol compounds, if present) and other additives to be described later. The composition may include a solvent in a residual amount except for a desired content of the (non-volatile) solid. In an embodiment, examples of the organic solvent may be an ethylene glycols such as ethyl 3-ethoxy propionate, ethylene glycol, diethylene glycol, polyethylene glycol, and the like; a glycol ether solvent such as ethylene glycol monomethylether, ethylene glycol monoethylether, diethylene glycol monomethylether, ethylene glycol diethylether, diethylene glycol dimethylether, and the like; a glycol etheracetate solvent such as ethylene glycol acetate, ethylene glycol monoethyletheracetate, diethylene glycol monoethyletheracetate, diethylene glycol monobutyletheracetate, and the like; a propylene glycol solvent such as propylene glycol, and the like; a propylene glycol ether such as propylene glycol monomethylether, propylene glycol monoethylether, propylene glycol monopropylether, propylene monobutylether, propylene glycol dimethylether, dipropylene glycol dimethylether, propylene glycol diethylether, dipropylene glycol diethylether, and the like; a propylene glycol etheracetate solvent such as propylene glycol monomethyl ether acetate, dipropylene glycol monoethyletheracetate, and the like; an amide solvent such as N-methylpyrrolidone, dimethyl formamide, dimethyl acetamide, and the like; a ketone solvent such as methylethylketone (MEK), methylisobutylketone (MIBK), cyclohexanone, and the like; a petroleum solvent such as toluene, xylene, solvent naphtha, and the like; an ester solvent such as ethyl acetate, butyl acetate, ethyl lactate, and the like; an ether solvent such as diethyl ether, dipropyl ether, dibutyl ether, and the like; chloroform, C1 to C40 aliphatic hydrocarbons (e.g., alkane, alkene, or alkyne), a halogen (e.g., chloro) substituted C1 to C40 aliphatic hydrocarbon (e.g., dichloroethane, trichloromethane, or the like), a C6 to C40 aromatic hydrocarbon (e.g., toluene, xylene, or the like), a halogen (e.g., chloro) substituted C6 to C40 aromatic hydrocarbon; or a combination thereof.

In addition to the aforementioned components, the composition (or composite) of an embodiment may further include an additive such as a light diffusing agent, a leveling agent, a coupling agent, or a combination thereof, if necessary. Components ((binder, monomer, solvent, additives, thiol compound, cardo binder, etc.) included in the composition of an embodiment may be appropriately selected, and for specific details thereof, for example, US-2017-0052444-A1 may be referred to.

The composition according to an embodiment may be prepared by a method that includes preparing a nanoparticle dispersion including the semiconductor nanoparticle of an embodiment, the dispersant, and a solvent; and mixing the nanoparticle dispersion with an initiator; a polymerizable monomer (e.g., an acryl-based monomers); optionally a thiol compound; optionally a metal oxide fine particle, and optionally the additive. Each of the aforementioned components may be mixed sequentially or simultaneously, and the mixing order is not particularly limited.

Figure 2:
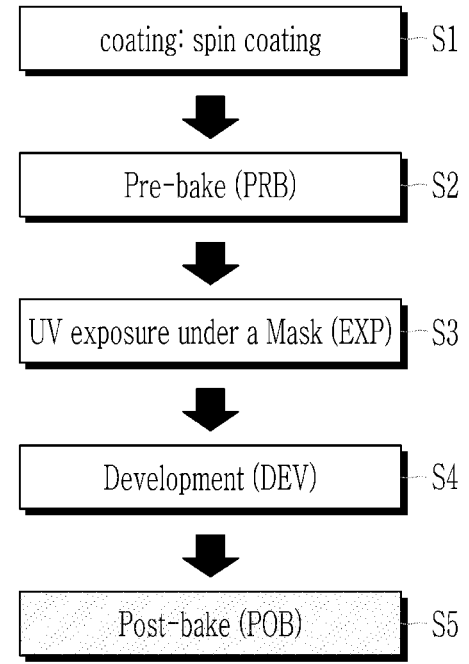
FIG. 2A is a schematic representation showing pattern formation process (photolithography method) using an ink composition including the semiconductor nanoparticles of an embodiment.
FIG. 2B is a schematic representation showing a pattern forming process (inkjet method) using the ink composition including the semiconductor nanoparticles of an embodiment.

The composition may provide a color conversion layer (or a patterned film of the composite) by (e.g., radical) polymerization. The color conversion layer (or the patterned film of the composite) may be produced using a photoresist composition. Referring to FIG. 2A, this method may include forming a film of the aforementioned composition on a substrate (S1); prebaking the film according to selection (S2); exposing a selected region of the film to light (e.g., having a wavelength of less than or equal to about 400 nm) (S3); and developing the exposed film with an alkali developing solution to obtain a pattern of a quantum dot-polymer composite (S4).

The composition of the embodiment may be applied to a predetermined thickness on a substrate using an appropriate method such as spin coating or slit coating to form a film S1. The formed film may be optionally subjected to a pre-baking (PRB) S2. The pre-baking may be performed by selecting an appropriate condition from known conditions of a temperature, time, an atmosphere, and the like.

The formed (or optionally prebaked) film may be exposed to light having a predetermined wavelength under a mask having a predetermined pattern S3. A wavelength and intensity of the light may be selected considering types and contents of the photoinitiator, types and contents of the quantum dots, and the like.

The exposed film is treated with an alkali developing solution (e.g., dipping or spraying) to dissolve an unexposed region and obtain a desired pattern S4. The obtained pattern may be, optionally, post-baked (POB) to improve crack resistance and solvent resistance of the pattern S5, for example, at a temperature of about 150° C. to about 230° C. for a predetermined time (e.g., greater than or equal to about 10 minutes or greater than or equal to about 20 minutes).

In an embodiment, the color conversion layer or the patterned film of the nanoparticle composite may have a plurality of repeating sections (that is, color conversion regions), and each repeating section may be formed by preparing a plurality of compositions including quantum dots (e.g., red light emitting quantum dots, green quantum dots, or optionally, blue quantum dots) having desired luminous properties (photoluminescence peak wavelength and the like) and repeating the aforementioned pattern-forming process as many times as necessary (e.g., 2 times or more, or 3 times or more) for each composition, resultantly obtaining a nanoparticle-polymer composite having a desired pattern. For example, the nanoparticle-polymer composite may have a pattern of at least two repeating color sections (e.g., RGB color sections) separated by a partition wall, e.g., black matrix (BM). This nanoparticle-polymer composite pattern may be used as a photoluminescence type color filter in a display device.

Figure 2B:
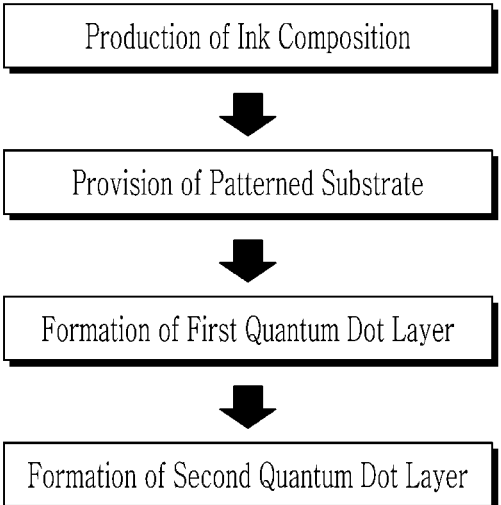

The color conversion layer or patterned film of the nanoparticle composite may be produced using an ink composition configured to form a pattern in an inkjet manner. Referring to FIG. 2B, such a method may include preparing an ink composition according to an embodiment, providing a substrate (e.g., with pixel areas patterned by electrodes and optionally banks or trench type partition walls, etc.), and depositing an ink composition on the substrate (or the pixel area) to form, for example, a first composite layer (or first region). The method may include depositing an ink composition on the substrate (or the pixel area) to form, for example, a second composite layer (or second region). The forming of the first composite layer and forming of the second composite layer may be simultaneously or sequentially carried out.

The depositing of the ink composition may be performed using an appropriate liquid crystal discharger, for example an inkjet or nozzle printing system (having an ink storage and at least one print head). The deposited ink composition may provide a (first or second) composite layer through the solvent removal and polymerization by the heating. The method may provide a highly precise nanoparticle-polymer composite film or patterned film for a short time by the simple method.

In the nanoparticle-polymer composite (e.g. first composite) of an embodiment, the (polymer) matrix may include the components described above with respect to the composition. In the composite, an amount of the matrix, based on a total weight of the composite, may be greater than or equal to about 10%, greater than or equal to about 20%, greater than or equal to about 30%, greater than or equal to about 40%, greater than or equal to about 50%, or greater than or equal to about 60%. The amount of the matrix may be, based on a total weight of the composite, less than or equal to about 95%, less than or equal to about 90%, less than or equal to about 80%, less than or equal to about 70%, less than or equal to about 60%, or less than or equal to about 50%.

The (polymer) matrix may include at least one of a dispersant (e.g., a carboxylic acid group-containing binder polymer), a polymerization product (e.g., an insulating polymer) of a polymerizable monomer including (at least one, for example, at least two, at least three, at least four, or at least five) carbon-carbon double bonds, and a polymerization product of the polymerizable monomer and a polythiol compound having at least two thiol groups at a terminal end. The matrix may include a linear polymer, a crosslinked polymer, or a combination thereof. The (polymer) matrix may not include a conjugated polymer (excluding cardo resin). The matrix may include a conjugated polymer.

The crosslinked polymer may include a thiolene resin, a crosslinked poly(meth)acrylate, a crosslinked polyurethane, a crosslinked epoxy resin, a crosslinked vinyl polymer, a crosslinked silicone resin, or a combination thereof. In an embodiment, the crosslinked polymer may be a polymerization product of the aforementioned polymerizable monomers and optionally a polythiol compound.

The linear polymer may include a repeating unit derived from a carbon-carbon unsaturated bond (e.g., a carbon-carbon double bond). The repeating unit may include a carboxylic acid group. The linear polymer may include an ethylene repeating unit.

The carboxylic acid group-containing repeating unit may include a unit derived from a monomer including a carboxylic acid group and a carbon-carbon double bond, a unit derived from a monomer having a dianhydride moiety, or a combination thereof.

The (polymer) matrix may include a carboxylic acid group-containing compound (e.g., a binder, a binder polymer, or a dispersant) (e.g., for dispersion of nanoparticles or a binder).

The first composite (or film or pattern thereof) may have, for example, a thickness of less than or equal to about 25 micrometers ($\mu$m), less than or equal to about 20 $\mu$m, less than or equal to about 15 $\mu$m, less than or equal to about 10 $\mu$m, less than or equal to about 8 $\mu$m, or less than or equal to about 7 $\mu$m and greater than about 2 $\mu$m, for example, greater than or equal to about 3 $\mu$m, greater than or equal to about 3.5 $\mu$m, greater than or equal to about 4 $\mu$m, greater than or equal to about 5 $\mu$m, greater than or equal to about 6 $\mu$m, greater than or equal to about 7 $\mu$m, greater than or equal to about 8 $\mu$m, greater than or equal to about 9 $\mu$m, or greater than or equal to about 10 $\mu$m.

The semiconductor nanoparticle, the composite (or the pattern thereof) including the semiconductor nanoparticle, or the color conversion panel including the same may be included in an electronic device. Such an electronic device may include a display device, a light emitting diode (LED), an organic light emitting diode (OLED), a quantum dot LED, a sensor, a solar cell, an imaging sensor, a photodetector, or a liquid crystal display device, but is not limited thereto. The aforementioned quantum dot may be included in an electronic apparatus. Such an electronic apparatus may include, but is not limited to, a portable terminal device, a monitor, a note PC, a television, an electric sign board, a camera, a car, and the like. The electronic apparatus may be a portable terminal device including a display device (or a light emitting device) including quantum dots, a monitor, a note PC, or a television. The electronic apparatus may be a camera or a mobile terminal device including an image sensor including quantum dots. The electronic apparatus may be a camera or a vehicle including a photodetector including quantum dots.

In an embodiment, the electronic device or the display device (e.g., display panel) may further include a color conversion layer (or a color conversion panel) and optionally, a light source. The light source may be configured to provide incident light to the color conversion layer or the color conversion panel. In an embodiment, the display panel includes a light emitting panel (or a light source), the aforementioned color conversion panel, a light transmitting layer between the aforementioned light emitting panel and the aforementioned color conversion panel. The color conversion panel includes a substrate, and the color conversion layer may be disposed on the substrate. See FIGS. 3A and 4.

(If present) the light source or the light emitting panel may be configured to provide an incident light to the color conversion layer or the color conversion panel. The incident light may have an emission peak wavelength of greater than or equal to about 440 nm, for example, greater than or equal to about 450 nm and less than or equal to about 580 nm, for example, less than or equal to about 480 nm, less than or equal to about 470 nm, or less than or equal to about 460 nm.

In an embodiment, the electronic device (e.g., a photoluminescent device) may further include a sheet of the nanoparticle composite. Referring to FIG. 3B, the device 400 may include a backlight unit 410 and a liquid crystal panel 420, wherein the backlight unit 410 may include a quantum dot polymer composite sheet (QD sheet). Specifically, the backlight unit 410 may have a structure that a reflector, a light guide plate (LGP), a light source (blue LED and the like), the quantum dot polymer composite sheet (QD sheet), and an optical film (a prism, a double brightness enhance film (DBEF, etc.) are stacked. The liquid crystal panel 420 may be disposed on the backlight unit 410 and have a structure that liquid crystals and a color filter are included between two polarizers (Pol). The quantum dot polymer composite sheet (QD sheet) may include semiconductor nanoparticles (e.g., quantum dots) emitting red light and green light after absorbing light from the light source. Blue light provided from the light source may be combined with the red light and the green light emitted from the semiconductor nanoparticles, while passing the quantum dot polymer composite sheet, and converted into white light. This white light may be separated into blue light, green light, and red light by a color filter in the liquid crystal panel and then, emitted to the outside for each pixel.

The color conversion panel may include a substrate, and the color conversion layer may be disposed on the substrate. The color conversion layer or the color conversion panel may include a patterned film of the nanoparticle composite. The patterned film may include a repeating section that is configured to emit light of a desired wavelength. The repeating section may include a second region. The second section may be a red light-emitting section. The repeating section may include a first region. The first section may be a green light-emitting section. The repeating section may include a third region. The third section may include a section that emits or transmits blue light. Details of the first, second, and third regions are as described herein.

The light emitting panel or the light source may be an element emitting an incident light (e.g., excitation light). The incident light may include blue light and optionally, green light. The light source may include an LED. The light source may include an organic LED (OLED). The light source may include a micro LED. On the front surface (light emitting surface) of the first region and the second region, an optical element to block (e.g., reflect or absorb) blue light (and optionally green light) for example, a blue light (and optionally green light) blocking layer or a first optical filter that will be described herein may be disposed. In an embodiment, the light source may include organic light emitting diode to emit blue light and an organic light emitting diode to emit green light, a green light removing filter may be further disposed on a third section through which blue light is transmitted.

The light emitting panel or the light source may include a plurality of light emitting units respectively corresponding to the first region and the second region, and the light emitting units may include a first electrode and a second electrode facing each other and an (organic) electroluminescent layer between the first electrode and the second electrode. The electroluminescent layer may include an organic light emitting material. For example, each light emitting unit of the light source may include an electroluminescent device (e.g., an organic light emitting diode (OLED)) structured to emit light of a predetermined wavelength (e.g., blue light, green light, or a combination thereof). Structures and materials of the electroluminescent device and the organic light emitting diode (OLED) are not particularly limited.

Hereinafter, the display panel and the color conversion panel will be described in more detail with reference to the drawings.

Figure 3A:
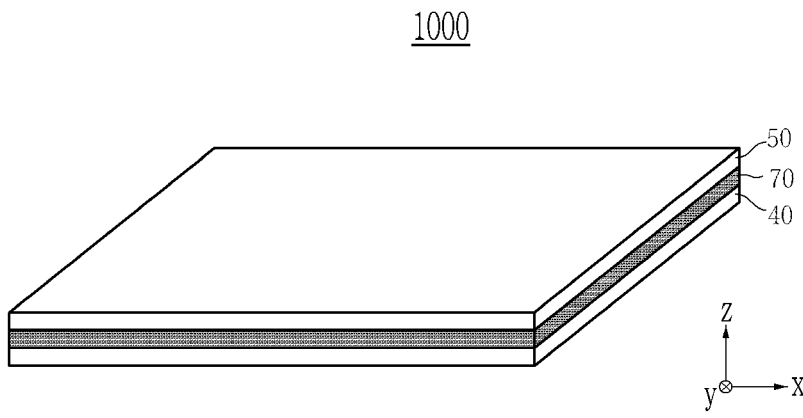
FIG. 3A is a perspective view illustrating an example of a display panel including a color conversion panel according to an embodiment.
Figure 3B:
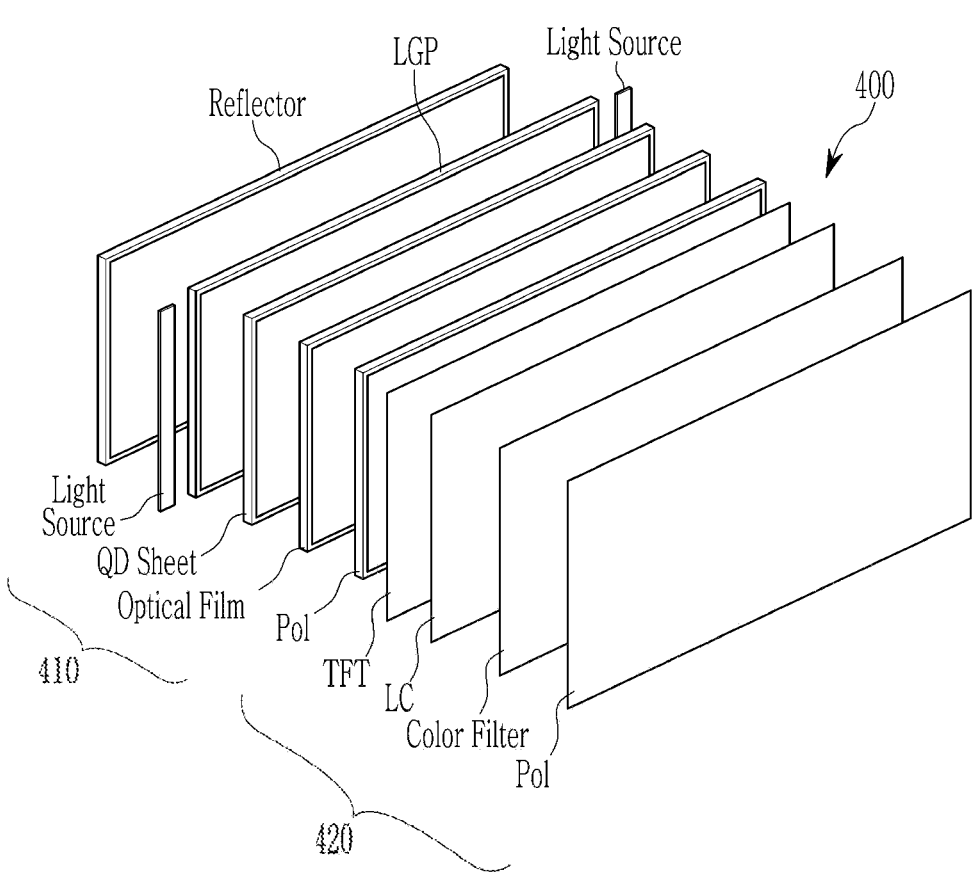
FIG. 3B is an exploded view of a display device according to another embodiment.
Figures 4, 5A:
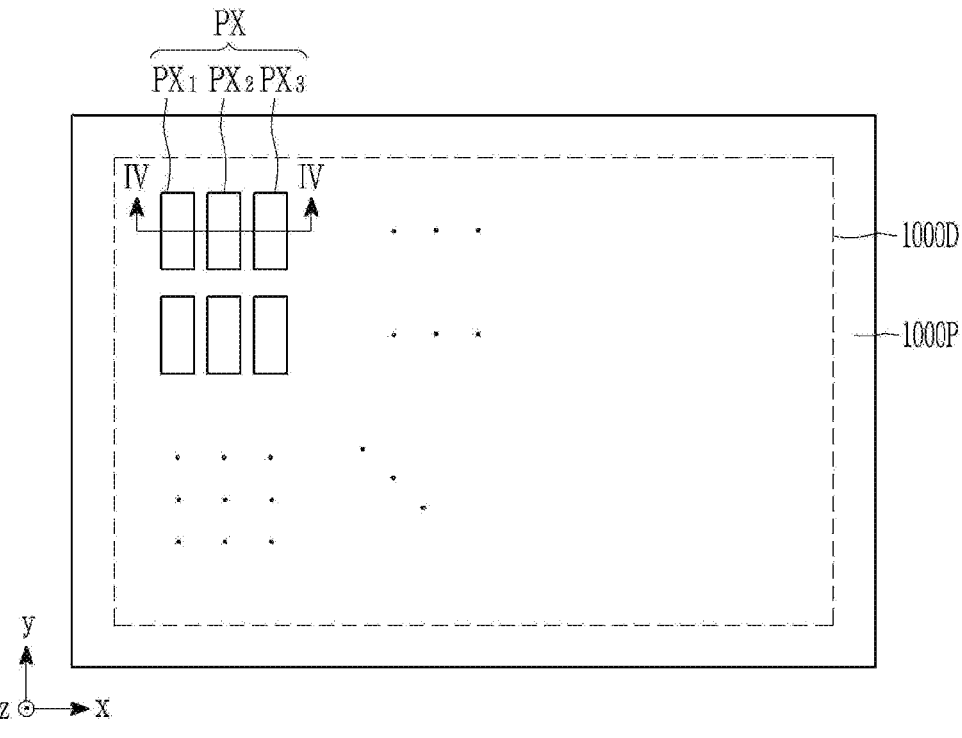
FIG. 4 is a cross-sectional representation of the display panel of FIG. 3A.
FIG. 5A is a plan view illustrating an example of a pixel arrangement of the display panel of FIG. 3A.

FIG. 3A is a perspective view of an embodiment of a display panel constructed according to the principles of the invention. FIG. 4 is a cross-sectional view of the display panel of FIG. 3A. Referring to FIGS. 3A and 4, the display panel 1000 according to an embodiment includes a light emitting panel 40 and a color conversion panel 50. The display panel or the electronic device may further include a light transmitting layer 60 disposed between the light emitting panel 40 and the color conversion panel 50, and a binding material 70 binding the light emitting panel 40 and the color conversion panel 50. The light transmitting layer may include a passivation layer, a filling material, an encapsulation layer, or a combination thereof. A material for the light transmitting layer may be appropriately selected without particular limitation. The material for the light transmitting layer may be an inorganic material, an organic material, an organic/inorganic hybrid material, or a combination thereof.

The light emitting panel 40 and the color conversion panel 50 each have a surface opposite the other, i.e., the two respective panels face each other, with the light transmitting layer (or the light transmitting panel) 60 disposed between the two panels. The color conversion panel 50 is disposed in a direction such that for example, light emitting from the light emitting panel 40 irradiates the light emitting panel 60. The binding material 70 is disposed along edges of the light emitting panel 40 and the color conversion panel 50, and may be, for example, a sealing material.

FIG. 5A is a plan view of an embodiment of a pixel arrangement of the display panel of an embodiment. Referring to FIG. 5a, the display panel 1000 includes a display area 1000D displaying an image and a non-display area 1000P positioned in a peripheral area of the display area 1000D and disposed with a binding material 70.

The display area 1000D includes a plurality of pixels PX arranged along with a row (e.g., x direction), column (e.g., y direction), and each representative pixel PX may include a plurality of sub-pixels $PX_1$, $PX_2$, and $PX_3$ expressing, e.g., displaying, different colors from the other. An embodiment is exemplified with a structure in which three sub-pixels $PX_1$, $PX_2$, and $PX_3$ are configured to provide a pixel. An embodiment may further include an additional sub-pixel such as a white sub-pixel and may further include a, e.g., at least one, sub-pixel expressing, e.g., displaying the same color. The plurality of pixels PX may be aligned, for example, in a Bayer matrix, a matrix sold under the trade designation PenTile, a diamond matrix, or a combination thereof.

The sub-pixels $PX_1$, $PX_2$, and $PX_3$ may express, e.g., display, three primary colors or a color of a combination of three primary colors, for example, may express, e.g., display, a color of red, green, blue, or a combination thereof. For example, the first sub-pixel $PX_1$ may express, e.g., display, red, and the second sub-pixel $PX_2$ may express, e.g., display, green, and the third sub-pixel $PX_3$ may express, e.g., display, blue.

In the drawing, all sub-pixels are exemplified to have the same size, but it is not limited thereto, and at least one of the sub-pixels may be larger or smaller than other sub-pixels. In In the drawing, all sub-pixels are exemplified to have the same shape, but it is not limited thereto and at least one of the sub-pixels may have different shape from other sub-pixels.

In the display panel or electronic device according to the embodiment, the light emitting panel may include a substrate and a TFT (e.g., oxide-based) disposed on the substrate. A light emitting device (e.g., having a tandem structure) may be disposed on the TFT.

The light emitting device may include a light emitting layer (e.g., a blue light emitting layer, a green light emitting layer, or a combination thereof) between the first and second electrodes facing each other. A charge generation layer may be disposed between each of the light emitting layers. Each of the first electrode and the second electrode may be patterned with a plurality of electrode elements to correspond to the pixel. The first electrode may be an anode or a cathode. The second electrode may be a cathode or an anode.

The light emitting device may include an organic LED, a nanorod LED, a mini LED, a micro LED, or a combination thereof. FIGS. 5B to 5E are cross-sectional views showing examples of light emitting devices, respectively. In an embodiment, "a mini LED" has a size of greater than or equal to about 100 micrometers, greater than or equal to about 150 micrometers, greater than or equal to about 200 micrometers and less than or equal to about 1 millimeter, less than or equal to about 0.5 millimeters, less than or equal to about 0.15 millimeters, or less than or equal to about 0.12 millimeters. In an embodiment, "a micro LED" may have a size of less than about 100 micrometers, less than or equal to about 50 micrometers, or less than or equal to about 10 micrometers. The size of the micro LED may be greater than or equal to about 0.1 micrometers, greater than or equal to about 0.5 micrometers, greater than or equal to about 1 micrometer, or greater than or equal to about 5 micrometers.

Figure 5B:
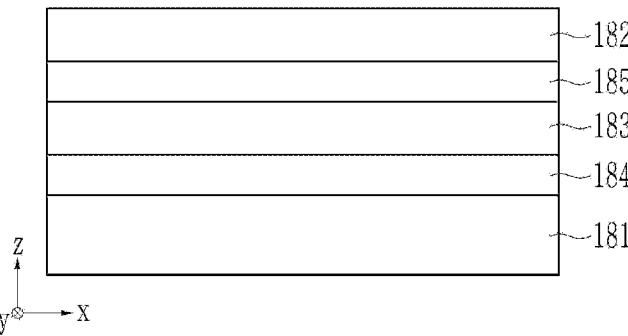
FIGS. 5B, 5C, 5D, and 5E are cross-sectional representations showing examples of light emitting devices, respectively.

Referring to FIG. 5B, the light emitting device 180 may include a first electrode 181 and a second electrode 182 facing each other; a light emitting layer 183 between the first electrode 181 and the second electrode 182; and optionally auxiliary layers 184 and 185 between the first electrode 181 and the light emitting layer 183 and between the second electrode 182 and the light emitting layer 183.

The first electrode 181 and the second electrode 182 may be disposed to face each other along a thickness direction (for example, z direction), and any one of the first electrode 181 and the second electrode 182 may be an anode and the other may be a cathode. The first electrode 181 may be a light transmitting electrode, a semi-transparent electrode, or a reflective electrode, and the second electrode 182 may be a light transmitting electrode or a semi-transparent electrode. The light transmitting electrode or semi-transparent electrode may be, for example, made of a thin single layer or multiple layers of metal thin film including conductive oxides such as indium tin oxide (ITO), indium zinc oxide (IZO), zinc oxide (ZnO), tin oxide (SnO), aluminum tin oxide (AlTO), and fluorine-doped tin oxide (FTO) or silver (Ag), copper (Cu), aluminum (Al), magnesium (Mg), magnesium-silver (Mg—Ag), magnesium-aluminum (Mg—Al), or a combination thereof. The reflective electrode may include a metal, a metal nitride, or a combination thereof, for example, silver (Ag), copper (Cu), aluminum (Al), gold (Au), titanium (Ti), chromium (Cr), nickel (Ni), an alloy thereof, a nitride thereof (e.g., TiN), or a combination thereof, but is not limited thereto.

The light emitting layer(s) 183 may emit a first light emitting body emitting light with a blue emission spectrum, a second light emitting body emitting light with a green emission spectrum, or a combination thereof.

The blue emission spectrum has a maximum emission wavelength in a wavelength region of greater than or equal to about 400 nm and less than about 500 nm and within the range, in a wavelength region of about 410 nm to about 490 nm, about 420 nm to about 480 nm, about 430 nm to about 470 nm, about 440 nm to about 465 nm, about 445 nm to about 460 nm, about 450 nm to about 458 nm, or a combination thereof.

The green emission spectrum may have a maximum emission wavelength in a wavelength region of greater than or equal to about 500 nm and less than about 590 nm and within the range, in a wavelength region of about 510 nm to about 580 nm, about 515 nm to about 570 nm, about 520 nm to about 560 nm, about 525 nm to about 555 nm, about 530 nm to about 550 nm, about 535 nm to about 545 nm, or a combination thereof.

In an embodiment, the light emitting layer 183 or the light emitting body included therein may include a phosphorescent material, a phosphor material, or a combination thereof. In an embodiment, the light emitting body may include an organic light emitting body, wherein the organic light emitting body may be a low molecular compound, a polymer compound, or a combination thereof. Specific types of the phosphorescent material and the phosphor material are not particularly limited but may be appropriately selected from known materials. In an embodiment, the light emitting body may include an inorganic light emitting body, and the inorganic light emitting body may be an inorganic semiconductor, a quantum dot, a perovskite, or a combination thereof. The inorganic semiconductor may include metal nitride, metal oxide, or a combination thereof. The metal nitride, the metal oxide, or the combination thereof may include aluminum, gallium, indium, Group III metal, thallium, and the like, silicon, germanium, Group IV metal such as tin, or a combination thereof. In an embodiment, the light emitting body may include an inorganic light emitting body, and the light emitting device 180 may be a quantum dot light emitting diode, a perovskite light emitting diode, or a micro light emitting diode (pLED). Materials usable as the inorganic light emitting body may be selected appropriately.

In an embodiment, the light emitting device 180 may further include an auxiliary layer 184 and 185. The auxiliary layer 184 and 185 may be disposed between a first electrode 181 and a light emitting layer 183 or between a second electrode 182 and a light emitting layer 183, respectively. The auxiliary layer 184 and 185 may be a charge auxiliary layer for controlling injection and/or mobility of charges. The auxiliary layer 184 and 185 may include at least one layer or two layers, respectively, and for example, it may include a hole injection layer, a hole transport layer, an electron blocking layer, an electron injection layer, an electron transport layer, a hole blocking layer, or a combination thereof. At least one of the auxiliary layers 184 and 185 may be omitted, if desired. The auxiliary layer may be formed of a material appropriately selected from materials known for an organic electroluminescent device and the like.

The light emitting devices 180 disposed in each of the subpixels $PX_1$, $PX_2$, and $PX_3$ may be the same or different from each other. The light emitting devices 180 in each of the subpixels $PX_1$, $PX_2$, and $PX_3$ may emit light having the same or different emission spectra. The light emitting devices 180 in each of the subpixels $PX_1$, $PX_2$, and $PX_3$ may emit, for example, light having a blue emission spectrum, light having a green emission spectrum, or a combination thereof. The light emitting devices 180 in each of the subpixels $PX_1$, $PX_2$, and $PX_3$ may be separated by a pixel defining layer (not shown).

Figure 5C:
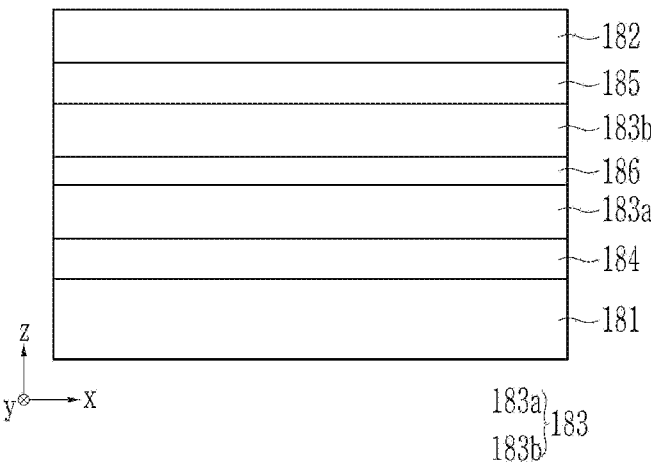

Referring to FIG. 5C, the light emitting device 180 may be a light emitting device having a tandem structure, and includes a first electrode 181 and a second electrode 182 facing each other; a first light emitting layer 183a and a second light emitting layer 183b between the first electrode 181 and the second electrode 182; a charge generation layer 186 between the first light emitting layer 183a and the second light emitting layer 183b, and optionally an auxiliary layer 184 and 185 between the first electrode 181 and the first light emitting layer 183a or between the second electrode 182 and the second light emitting layer 183b.

Details of the first electrode 181, the second electrode 182, and the auxiliary layer 184 and 185 are the same as described herein.

The first light emitting layer 183a and the second light emitting layer 183b may emit light having the same or different emission spectra. In an embodiment, the first light emitting layer 183a or the second light emitting layer 183b may emit light having a blue emission spectrum or light having a green emission spectrum, respectively. The charge generation layer 186 may inject an electric charge into the first light emitting layer 183a and/or the second light emitting layer 183b and may control a charge balance between the first light emitting layer 183a and the second light emitting layer 183b. The charge generation layer 186 may include, for example, an n-type layer and a p-type layer, and may include, for example, an electron transport material and/or a hole transport material including an n-type dopant and/or a p-type dopant. The charge generation layer 186 may include one layer or two or more layers.

Figure 5D:
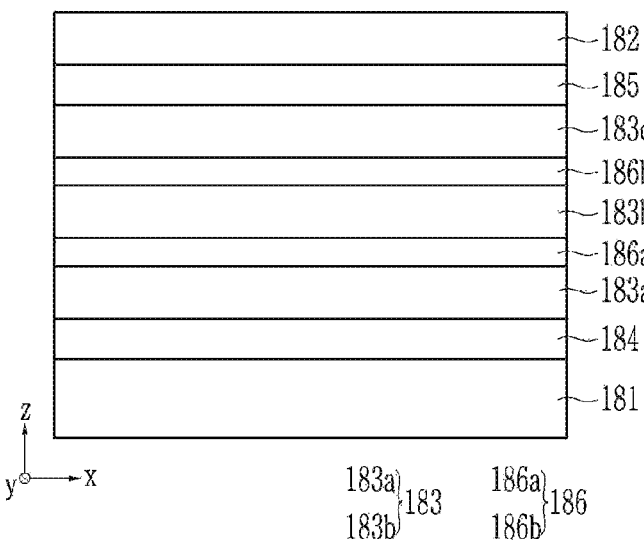

Referring to FIG. 5D, a light emitting device (having a tandem structure) may include a first electrode 181 and a second electrode 182 facing each other; a first light emitting layer 183a, a second light emitting layer 183b, and a third light emitting layer 183c between the first electrode 181 and the second electrode 182; a first charge generation layer 186a between the first light emitting layer 183a and the second light emitting layer 183b; a second charge generation layer 186b between the second light emitting layer 183b and the third light emitting layer 183c; and optionally, an auxiliary layer 184 and 185 between the first electrode 181 and the first light emitting layer 183a or between the second electrode 182 and the third light emitting layer 183c.

Details of the first electrode 181, the second electrode 182, and the auxiliary layer 184 and 185 are the same as described herein.

The first light emitting layer 183a, the second light emitting layer 183b, and the third light emitting layer 183c may emit light having the same or different emission spectra. The first light emitting layer 183a, the second light emitting layer 183b, and the third light emitting layer 183c may emit blue light. In an embodiment, the first light emitting layer 183a and the third light emitting layer 183c may emit light of a blue emission spectrum, and the second light emitting layer 183b may emit light of a green emission spectrum. In another embodiment, the first light emitting layer 183a and the third light emitting layer 183c may emit light of a green emission spectrum, and the second light emitting layer 183b may emit light of a blue emission spectrum.

The first charge generation layer 186a may inject an electric charge into the first light emitting layer 183a and/or the second light emitting layer 183b, and may control charge balances between the first light emitting layer 183a and the second light emitting layer 183b. The second charge generation layer 186a may inject an electric charge into the second light emitting layer 183b and/or the third light emitting layer 183c and may control charge balances between the second light emitting layer 183b and the third light emitting layer 183c. Each of the first and second charge generation layers 186a and 186b may include one layer or two or more layers, respectively.

Figure 5E:
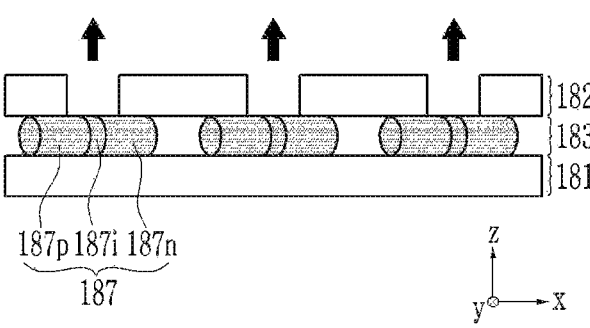

Referring to FIG. 5E, in an embodiment, the light emitting device 180 includes a light emitting layer 183 including a first electrode 181, a second electrode 182, and a plurality of nanostructures 187.

One of the first electrode 181 and the second electrode 182 may be an anode and the other may be a cathode. The first electrode 181 and the second electrode 182 may be an electrode patterned according to a direction of an arrangement of the plurality of nanostructures 187, and may include, for example, a conductive oxide such as indium tin oxide (ITO), indium zinc oxide (IZO), zinc oxide (ZnO), tin oxide (SnO), aluminum tin oxide (AlTO), and fluorine-doped tin oxide (FTO); silver (Ag), copper (Cu), aluminum (Al), gold (Au), titanium (Ti), chromium (Cr), nickel (Ni), an alloy thereof, a nitride thereof (e.g., TiN); or a combination thereof, but are not limited thereto.

The light emitting layer 183 may include a plurality of nanostructures 187, and each of the subpixels PX$_1$, PX$_2$, and PX$_3$ may include a plurality of nanostructures 187. In an embodiment, the plurality of nanostructures 187 may be arranged in one direction, but the present disclosure is not limited thereto. The nanostructures 187 may be a compound-based semiconductor that is configured to emit light of a predetermined wavelength for example with an application of an electric current, and may be, for example, a linear nanostructure such as a nanorod or a nanoneedle. A diameter or a long diameter of the nanostructures 187 may be, for example, several to several hundreds of nanometers, and aspect ratios of the nanostructures 187 may be in the range of greater than about 1, greater than or equal to about 1.5, greater than or equal to about 2.0, greater than or equal to about 3.0, greater than or equal to about 4.0, greater than or equal to about 4.5, greater than or equal to about 5.0, greater than about 1 and less than or equal to about 20, about 1.5 to about 20, about 2.0 to about 20, about 3.0 to about 20, about 4.0 to about 20, about 4.5 to about 20, or about 5.0 to about 20, or a combination thereof.

Each of the nanostructures 187 may include a p-type region 187p, an n-type region 187n, and a multiple quantum well region 187i, and may be configured to emit light from the multiple quantum well region 187i. The nanostructure 187 may include, for example, gallium nitride (GaN), indium gallium nitride (InGaN), aluminum gallium nitride (AlGaN), or a combination thereof, and may have, for example, a core-shell structure.

The plurality of nanostructure 187 may emit light having the same or different emission spectra. In an embodiment, the first nanostructure 187a may emit light of a blue emission spectrum, for example, light of a blue emission spectrum having a maximum emission wavelength in a wavelength region of greater than or equal to about 400 nm and less than 500 nm, about 410 nm to about 490 nm, or about 420 nm to about 480 nm.

Figure 6:
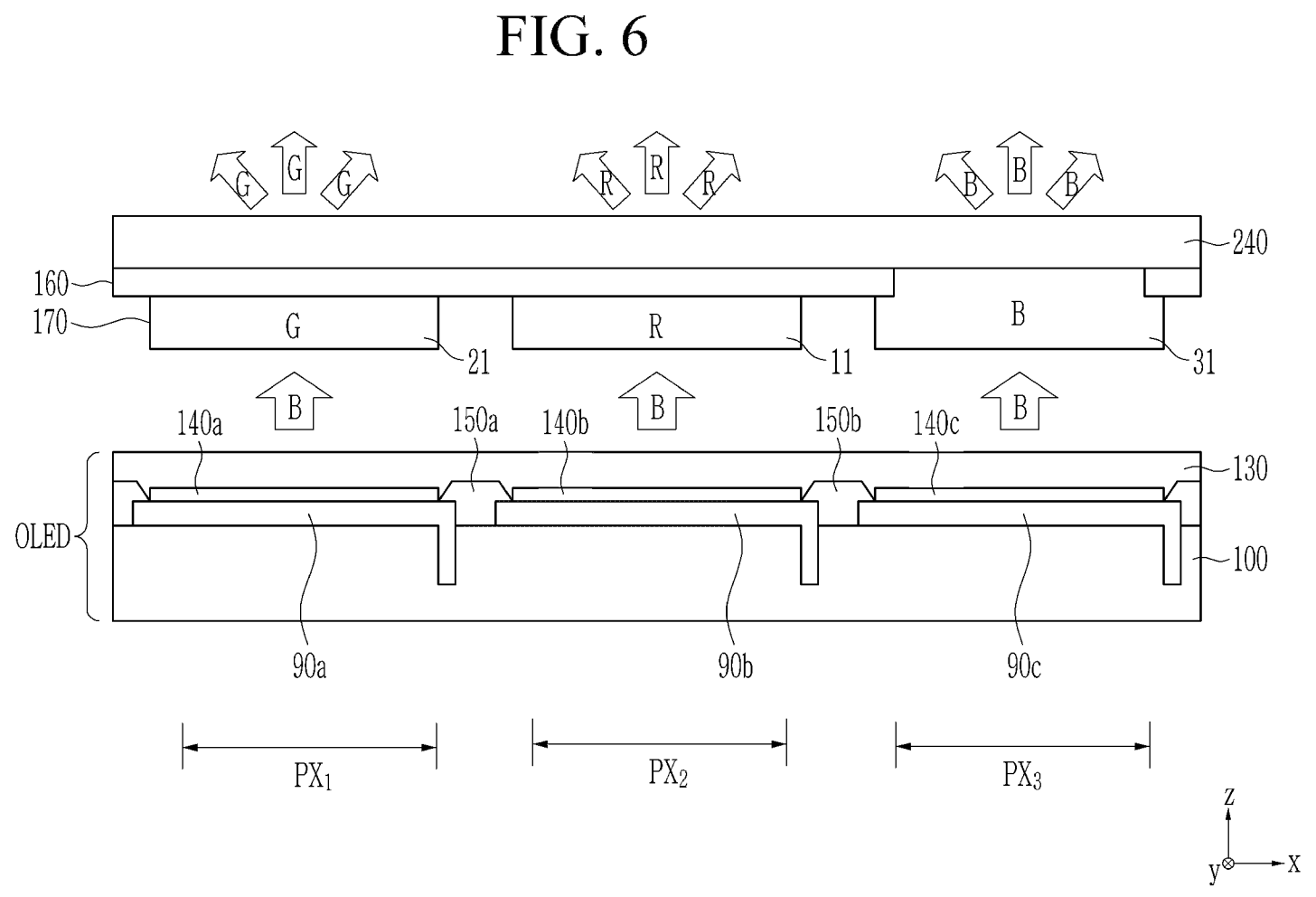

FIG. 6 is a schematic cross-sectional view of a device (or a display panel) according to embodiments. Referring to FIG. 6, the light source (or the light emitting panel) may include an organic light emitting diode that emits blue (B) light (and optionally green light). The organic light emitting diode (OLED) may include at least two pixel electrodes 90a, 90b, 90c formed on the substrate 100, a pixel defining layer 150a, 150b formed between the adjacent pixel electrodes 90a, 90b, 90c, an organic light emitting layer 140a, 140b, 140c formed on each pixel electrode 90a, 90b, 90c, and a common electrode layer 130 formed on the organic light emitting layer 140a, 140b, 140c. A thin film transistor and a substrate may be disposed under the organic light emitting diode (OLED). Pixel areas of the OLED may be disposed corresponding to the first, second, and third s described herein. In an embodiment, the color conversion panel and the light emitting panel may be separated as shown in FIG. 6. In an embodiment, the color conversion panel may be stacked directly on the light emitting panel.

A laminated structure including the luminescent nanostructure composite pattern 170 (e.g., a first region 11 or R including red light emitting luminescent nanostructures, a second region 21 or G including green light emitting luminescent nanostructures, and a third region 31 or B including or not including a luminescent nanostructure, e.g., a blue light emitting luminescent nanostructure) and substrate 240 may be disposed on the light source. The blue light emitted from the light source enters the first region and second region and may emit red light and green light, respectively. The blue light emitted from the light source may pass through the third region. An element (first optical filter 160 or excitation light blocking layer) configured to block the excitation light may be disposed between the luminescent nanostructure composite layers R and G and the substrate, if desired. In an embodiment, the excitation light includes blue light and green light, a green light blocking filter (not shown) may be added to the third region. The first optical filter or the excitation light blocking layer will be described in more detail herein.

Such a (display) device may be produced by separately producing the aforementioned laminated structure and LED or OLED (e.g., emitting blue light) and then combining the laminated structure and LED or OLED. The (display) device may be produced by directly forming the luminescent nanostructure composite pattern on the LED or OLED.

In the color conversion panel or a display device, a substrate may be a substrate including an insulation material. The substrate may include glass; a polymer such as a polyester of polyethylene terephthalate (PET), polyethylene naphthalate (PEN), or the like, polycarbonate, and polyacrylate; polysiloxane (e.g. PDMS); an inorganic material such as $Al_2O_3$ or ZnO; or a combination thereof, but is not limited thereto. A thickness of the substrate may be appropriately selected taking into consideration a substrate material but is not particularly limited. The substrate may have flexibility. The substrate may have a transmittance of greater than or equal to about 50%, greater than or equal to about 60%, greater than or equal to about 70%, greater than or equal to about 80%, or greater than or equal to about 90% for light emitted from the semiconductor nanoparticle.

A wire layer including a thin film transistor or the like may be formed on the substrate. The wire layer may further include a gate line, a sustain voltage line, a gate insulating film, a data line, a source electrode, a drain electrode, a semiconductor layer, a protective layer, and the like. The detailed structure of the wire layer may vary depending on an embodiment. The gate line and the sustain voltage line may be electrically separated from each other, and the data line is insulated and crossing the gate line and the sustain voltage line. The gate electrode, the source electrode, and the drain electrode may form a control terminal, an input terminal, and an output terminal of the thin film transistor, respectively. The drain electrode may be electrically connected to the pixel electrode that will be described later.

The pixel electrode may function as an electrode (e.g., anode) of the display device. The pixel electrode may be formed of a transparent conductive material such as indium tin oxide (ITO) or indium zinc oxide (IZO). The pixel electrode may be formed of a material having a light blocking property such as gold (Au), platinum (Pt), nickel (Ni), tungsten (W), chromium (Cr), molybdenum (Mo), iron (Fe), cobalt (Co), copper (Cu), palladium (Pd), or titanium (Ti). The pixel electrode may have a two-layered structure where the transparent conductive material and the material having light blocking properties are stacked sequentially.

Between two adjacent pixel electrodes, a pixel defining layer (PDL) overlaps with a terminal end of the pixel electrode to divide the pixel electrode into a pixel unit. The pixel defining layer is an insulating layer which may electrically block the at least two pixel electrodes.

The pixel defining layer covers a portion of the upper surface of the pixel electrode, and the remaining region of the pixel electrode where is not covered by the pixel defining layer may provide an opening. An organic light emitting layer that will be described later may be formed on the region defined by the opening.

The organic light emitting layer may define each pixel area by the aforementioned pixel electrode and the pixel define layer. In other words, one pixel area may be defined as an area where is formed with one organic light emitting unit layer which is contacted with one pixel electrode divided by the pixel define layer. In the display device according to an embodiment, the organic light emitting layer may be defined as a first pixel area, a second pixel area and a third pixel area, and each pixel area may be spaced apart from each other leaving a predetermined interval by the pixel define layer.

In an embodiment, the organic light emitting layer may emit a third light belonging to a visible light region or belonging to an ultraviolet (UV) region. Each of the first to the third pixel areas of the organic light emitting layer may emit a third light. In an embodiment, the third light may be a light having a higher energy in a visible light region, and for example, may be a blue light (and optionally a green light). In an embodiment, all pixel areas of the organic light emitting layer are designed to emit the same light, and each pixel area of the organic light emitting layer may be all formed of the same or similar materials or may show the same or similar properties. Thus, a process of forming the organic light emitting layer may be simplified, and the display device may be easily applied for, e.g., made by, a large scale/large area process. However, the organic light emitting layer according to an embodiment is not necessarily limited thereto, but the organic light emitting layer may be designed to emit at least two different lights, e.g., at least two different colored lights.

The organic light emitting layer includes an organic light emitting unit layer in each pixel area, and each organic light emitting unit layer may further include an auxiliary layer (e.g., hole injection layer, hole transport layer, electron transport layer, etc.) besides the light emitting layer.

The common electrode may function as a cathode of the display device. The common electrode may be formed of a transparent conductive material such as indium tin oxide (ITO) or indium zinc oxide (IZO). The common electrode may be formed on the organic light emitting layer and may be integrated therewith.

A planarization layer or a passivation layer (not shown) may be formed on the common electrode. The planarization layer may include a (e.g., transparent) insulating material for ensuring electrical insulation with the common electrode.

In an embodiment, the display device may further include a lower substrate, a polarizing plate disposed under the lower substrate, and a liquid crystal layer disposed between the laminated structure and the lower substrate, and in the laminated structure, the photoluminescence layer (i.e., light emitting layer) may be disposed to face the liquid crystal layer. The display device may further include a polarizing plate between the liquid crystal layer and the light emitting layer. The light source may further include LED and if desired, a light guide plate.

Figure 7:
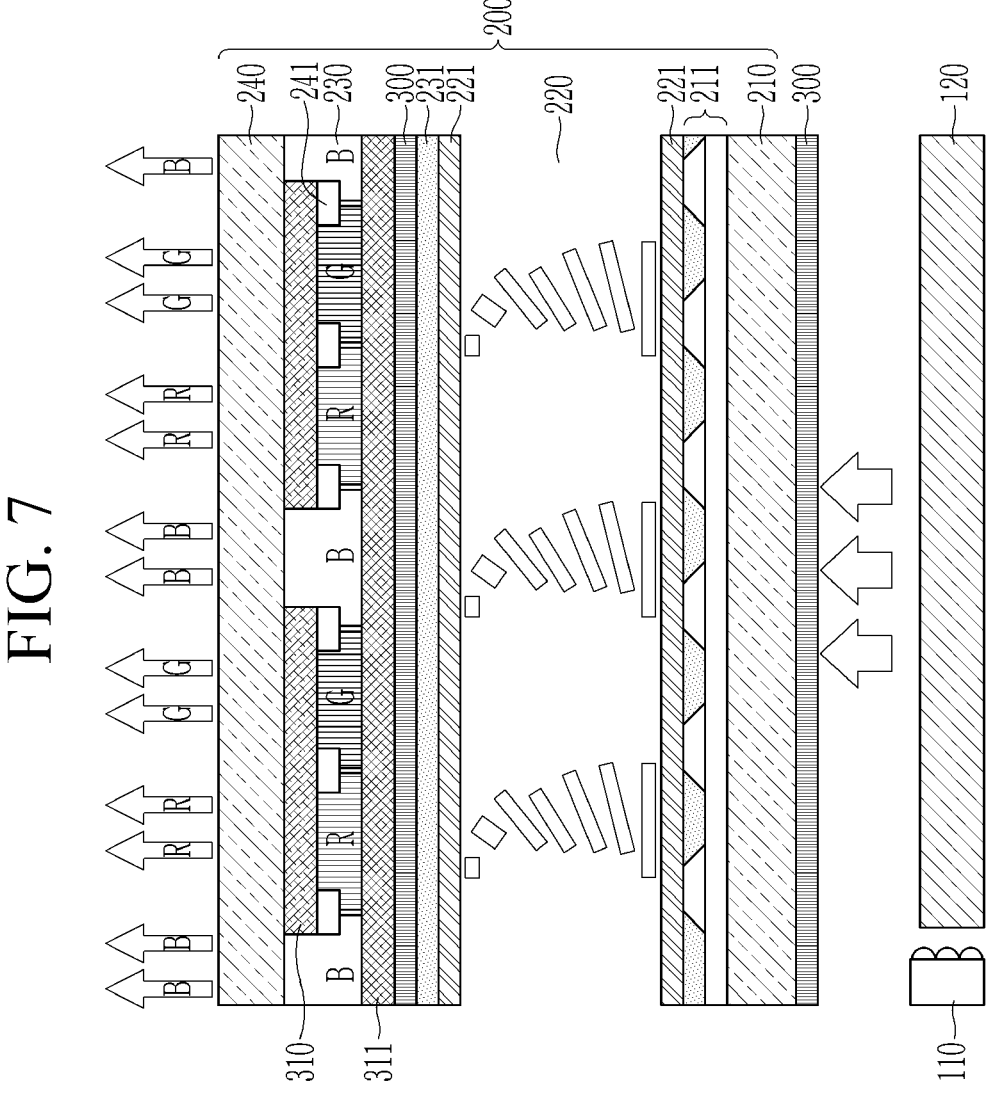
FIG. 7 is a schematic cross-sectional representation of an electronic device (e.g., a light emitting device) according to an embodiment.

In an embodiment, the display device (e.g., a liquid crystal display device) are illustrated with a reference to a drawing. FIG. 7 is a schematic cross-sectional view showing a liquid crystal display device according to an embodiment.

Referring to FIG. 7, the display device of an embodiment includes a liquid crystal panel 200, a polarizing plate 300 disposed under the liquid crystal panel 200, and a backlight unit disposed under the polarizing plate 300.

The liquid crystal panel 200 may include a lower substrate 210, a stacked structure, and a liquid crystal layer 220 disposed between the stack structure and the lower substrate. The stack structure may include a transparent substrate 240, a first optical filter layer 310, a photoluminescent layer 230 including a pattern of a semiconductor nanoparticle polymer composite, and a second optical filter layer 311.

The lower substrate 210, also referred to as an array substrate, may be a transparent insulating material substrate. The substrate is the same as described herein. A wire plate 211 may be provided on an upper surface of the lower substrate 210. The wire plate 211 may include a plurality of gate wires (not shown) and data wires (not shown) that define a pixel area, a thin film transistor disposed adjacent to a crossing region of gate wires and data wires, and a pixel electrode for each pixel area, but is not limited thereto. Details of such a wire plate are not particularly limited.

A liquid crystal layer 220 is provided on the wire plate 211. The liquid crystal panel 200 may include an alignment layer 221 on and under the liquid crystal layer 220 to initially align the liquid crystal material included therein. Details (e.g., a liquid crystal material, an alignment layer material, a method of forming liquid crystal layer, a thickness of liquid crystal layer, or the like) of the liquid crystal layer and the alignment layer are not particularly limited.

A lower polarizing plate 300 may be provided under the lower substrate. Materials and structures of the polarizing plate 300 are not particularly limited. A backlight unit (e.g., emitting blue light) may be disposed under the polarizing plate 300. An upper optical element or the polarizing plate 300 may be provided between the liquid crystal layer 220 and the transparent substrate 240, but is not limited thereto. For example, the upper polarizing plate may be disposed between the liquid crystal layer 220 and the photoluminescent layer 230. The polarizing plate may be any polarizer that can be used in a liquid crystal display device. The polarizing plate may be TAC (triacetyl cellulose) having a thickness of less than or equal to about 200 μm, but is not limited thereto. In another embodiment, the upper optical element may be a coating that controls a refractive index without a polarization function.

The backlight unit includes a light source 110. The light source may emit blue light or white light. The light source may include, but is not limited to, a blue LED, a white LED, a white OLED, or a combination thereof.

The backlight unit may further include a light guide plate 120. In an embodiment, the backlight unit may be of an edge type. For example, the backlight unit may include a reflector (not shown), a light guide plate (not shown) provided on the reflector and providing a planar light source with the liquid crystal panel 200, and/or at least one optical sheet (not shown) on the light guide plate, for example, a diffusion plate, a prism sheet, and the like, but the present disclosure is not limited thereto. The backlight unit may not include a light guide plate. In an embodiment, the backlight unit may be direct lighting. For example, the backlight unit may have a reflector (not shown) and a plurality of fluorescent lamps on the reflector at regular intervals, or may have an LED operating substrate on which a plurality of light emitting diodes, a diffusion plate thereon, and optionally at least one optical sheet may be disposed. Details (e.g., each component of a light emitting diode, a fluorescent lamp, a light guide plate, various optical sheets, and a reflector) of such a backlight unit are known and are not particularly limited.

A black matrix 241 is provided under the transparent substrate 240 and has openings and hides a gate line, a data line, and a thin film transistor of the wire plate on the lower substrate. For example, the black matrix 241 may have a grid shape. The photoluminescent layer 230 is provided in the opening of the black matrix 241 and has a photoluminescent layer 230 having a nanoparticle-polymer composite pattern including a first region (R) configured to emit first light (e.g., red light), a second region (G) configured to emit second light (e.g., green light), and a third region (B) configured to emit/transmit, for example blue light. If desired, the photoluminescent layer may further include at least one fourth region. The fourth region may include a quantum dot that emits different color from light emitted from the first to third regions (e.g., cyan, magenta, and yellow light).

In the photoluminescent layer 230, sections forming the pattern may be repeated corresponding to pixel areas formed on the lower substrate. A transparent common electrode 231 may be provided on the photoluminescent color filter layer 230.

The third region (B) configured to emit/transmit blue light may be a transparent color filter that does not change the emission spectrum of the light source. In this case, blue light emitted from the backlight unit may enter in a polarized state and may be emitted through the polarizing plate and the liquid crystal layer as it is. If needed, the third region may include a quantum dot emitting blue light.

As described above, if desired, the display device or light emitting device according to an embodiment may further include an excitation light blocking layer or a first optical filter layer (hereinafter, referred to as a first optical filter layer). The first optical filter layer may be disposed between the bottom surface of the first region (R) and the second region (G) and the substrate (e.g., the upper substrate 240) or on the upper surface of the substrate. The first optical filter layer may be a sheet having an opening in a portion corresponding to a pixel area (third region) displaying blue, and thus may be formed in portions corresponding to the first and second regions. That is, the first optical filter layer may be integrally formed at positions other than the position overlapped with the third region as shown in FIGS. 2A, 2B, and 3, but is not limited thereto. Two or more first optical filter layers may be spaced apart from each other at positions overlapped with the first and second regions, and optionally, the third region. When the light source includes a green light emitting device, a green light blocking layer may be disposed on the third region.

The first optical filter layer may block light having, for example, a predetermined wavelength region in the visible light region and may transmit light in the other wavelength regions, and for example, it may block blue light (or green light) and may transmit light except the blue light (or green light). The first optical filter layer may transmit, for example, green light, red light, and/or yellow light which is a mixed color thereof. The first optical filter layer may transmit blue light and block green light, and may be disposed on the blue light emitting pixel.

The first optical filter layer may substantially block excitation light and transmit light in a desired wavelength region. The transmittance of the first optical filter layer for the light in a desired wavelength range may be greater than or equal to about 70%, greater than or equal to about 80%, greater than or equal to about 90%, or even about 100%.

The first optical filter layer configured to selectively transmit red light may be disposed at a position overlapped with the red light emitting section, and the first optical filter layer configured to selectively transmit green light may be disposed at a position overlapped with the green light emitting section. The first optical filter layer may include a first filter region that blocks (e.g., absorb) blue light and red light and selectively transmits light of a predetermined range (e.g., greater than or equal to about 500 nm, greater than or equal to about 510 nm, or greater than or equal to about 515 nm and less than or equal to about 550 nm, less than or equal to about 545 nm, less than or equal to about 540 nm, less than or equal to about 535 nm, less than or equal to about 530 nm, less than or equal to about 525 nm, or less than or equal to about 520 nm); a second filter region that blocks (e.g., absorb) blue light and green light and selectively transmits light of a predetermined range (e.g., greater than or equal to about 600 nm, greater than or equal to about 610 nm, or greater than or equal to about 615 nm and less than or equal to about 650 nm, less than or equal to about 645 nm, less than or equal to about 640 nm, less than or equal to about 635 nm, less than or equal to about 630 nm, less than or equal to about 625 nm, or less than or equal to about 620 nm); or the first filter region and the second filter region. In an embodiment, the light source may emit a blue and green mixed light, and the first optical filter may further include a third filter region that selectively transmits blue light and blocks green light.

The first filter region may be disposed at a position overlapped with the green light emitting section. The second filter region may be disposed at a position overlapped with the red light emitting section. The third filter region may be disposed at a position overlapped with the blue light emitting section.

The first filter region, the second filter region, and, optionally, the third filter region may be optically isolated. Such a first optical filter layer may contribute to improvement of color purity of the display device.

The display device may further include a second optical filter layer (e.g., recycling layer of red/green light or yellow light) that is disposed between the photoluminescent layer and the liquid crystal layer (e.g., between the photoluminescent layer and the upper polarizer), transmits at least a portion of the third light (excitation light), and reflects at least a portion of the first light and/or the second light. One of the first light and the second light may be red light and the other may be green light, and the third light may be blue light. The second optical filter layer may transmit only the third light (B) in a blue light wavelength region having a wavelength region of less than or equal to about 500 nm and light in a wavelength region of greater than about 500 nm, which is green light (G), yellow light, red light (R), or the like, may be not passed through the second optical filter layer 140 and reflected. The reflected green light and red light may pass through the first and second regions and to be emitted to the outside of the display device 10.

The second optical filter layer or the first optical filter layer may be formed as an integrated layer having a relatively planar surface.

The first optical filter layer may include a polymer thin film including a dye and/or a pigment absorbing light in a wavelength which is to be blocked. The second optical filter layer or the first optical filter layer may include a single layer having a low refractive index, and may be, for example, a transparent thin film having a refractive index of less than or equal to about 1.4:1, less than or equal to about 1.3, or less than or equal to about 1.2. The second optical filter layer or the first optical filter layer having a low refractive index may include, for example, a porous silicon oxide, a porous organic material, a porous organic-inorganic composite, or a combination thereof.

The first optical filter layer or the second optical filter layer may include a plurality of layers having different refractive indexes. The first optical filter layer or the second optical filter layer may be formed by laminating two layers having different refractive indexes. For example, the first/second optical filter layer may be formed by alternately laminating a material having a high refractive index and a material having a low refractive index.

In an embodiment, the electronic device may include a light emitting device (e.g., an electroluminescent device) including the nanoparticles described above. The light emitting device includes an anode 1 and a cathode 5 facing each other; a quantum dot light emitting layer 3 disposed between the anode and the cathode and including a plurality of quantum dots; and a hole auxiliary layer 2 between the anode and the quantum dot light emitting layer. The hole auxiliary layer may further include a hole injecting layer (HIL), a hole transporting layer (HTL), an electron blocking layer (EBL), or a combination thereof. The hole auxiliary layer may include any organic/inorganic material having hole characteristics. The quantum dot light emitting device may further include an electron auxiliary layer 4 between the cathode and the quantum dot light emitting layer. The electron auxiliary layer may further include an electron injecting layer (EIL), an electron transporting layer (ETL), a hole blocking layer (HBL), or a combination thereof. The electron auxiliary layer may include any organic/inorganic material having electronic properties.

Hereinafter, the embodiments are illustrated in more detail with reference to examples. However, they are exemplary embodiments of the present invention, and the present invention is not limited thereto.

EXAMPLES

Analysis Methods

[1] UV-Vis Absorption Spectroscopy Analysis and Photoluminescence Spectroscopy Analysis A photoluminescence (PL) spectrum of a semiconductor nanoparticle or a composite including a plurality of a semiconductor nanoparticles is obtained at an excitation wavelength of 450 nm using a Hitachi F-7000 spectrophotometer.

A UV spectroscopy analysis is performed using an Agilent Cary 5000 spectrophotometer to obtain a UV-Visible absorption spectrum.

[2] ICP Analysis

Inductively coupled plasma atomic emission spectroscopy (ICP-AES) is performed using a Shimadzu ICPS-8100.

[3] Transmission Electron Microscope (TEM) Analysis

Transmission electron microscope analysis and EELS analysis of the produced nanoparticles are performed using a UT F30 Tecnai electron microscope.

Preparation of a First Semiconductor Nanocrystal

Example 1

Silver acetate is dissolved in oleyl amine to prepare a 0.06 M silver precursor containing solution (hereinafter, abbreviated as "silver precursor"). Sulfur is dissolved in oleyl amine to prepare a 1 M sulfur precursor containing solution (hereinafter, abbreviated as "sulfur precursor"). Indium chloride is dissolved in ethanol to prepare a 0.2 M indium precursor containing solution (hereinafter, abbreviated as an indium precursor).

Octadecene (ODE), and dodecanethiol are added to a 250 mL reaction flask and heated at 120° C. for 10 minutes under vacuum. Nitrogen is introduced into the flask cooled to room temperature, and then the silver precursor, the sulfur precursor, and the indium precursor are added to the flask. The flask is heated to a reaction temperature of 210° C. and a reaction proceeds at this temperature for 25 minutes. After decreasing the temperature of the flask to 180° C., trioctylphosphine (TOP) is added to the flask, followed by the addition of hexane and ethanol to facilitate the precipitation of first semiconductor nanocrystals, which are then separated via centrifugation and dispersed in toluene.

The amount of the indium precursor and the sulfur precursor added to the reaction flask provide for 5 mole equivalents of indium and 8 mole equivalents of sulfur per one mole of silver.

Figure 8A:
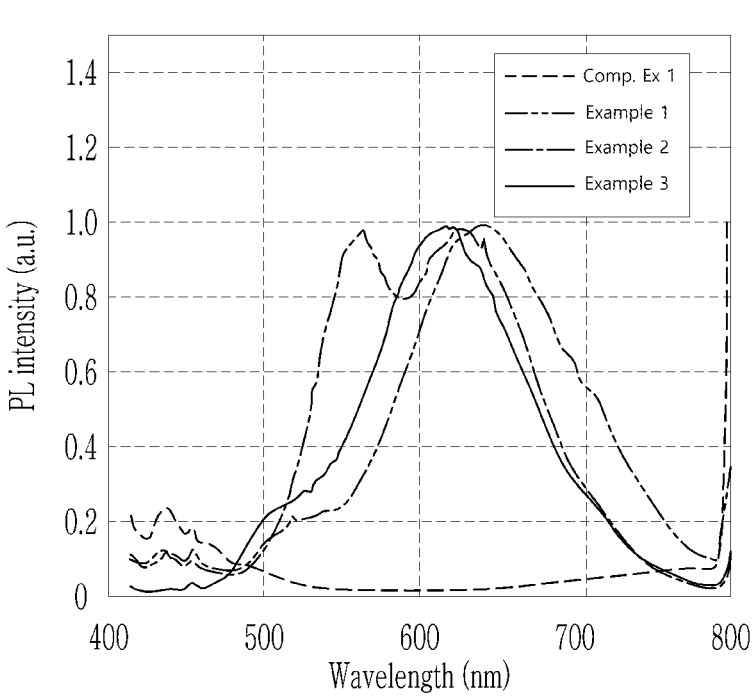
FIG. 8A shows photoluminescent spectra of the semiconductor nanoparticles of Examples 1 to 3 and Comparative Example 1.
Figure 8B:
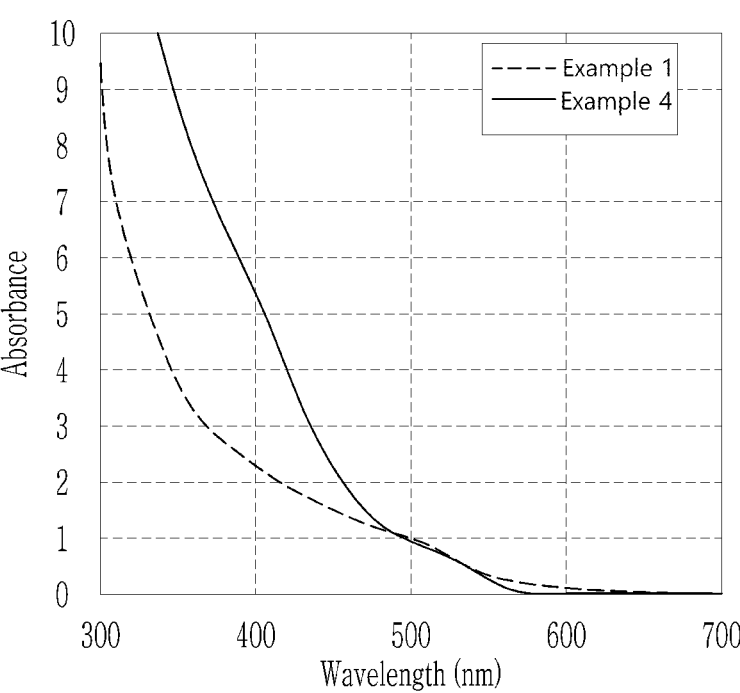
FIG. 8B shows UV-Vis absorption spectra of the semiconductor nanoparticle prepared in Example 1 and Example 4.

A photoluminescence spectroscopy analysis and an UV-Vis absorption spectroscopy of the obtained semiconductor nanocrystals are conducted and the results thereof are shown in FIGS. 8A, 8B, and Table 1. An ICP-AES analysis and a TEM analysis are conducted for the obtained semiconductor nanocrystals and the results are shown in Table 2. The obtained semiconductor nanocrystals have an average particle size of about 3.3 nm.

Example 2

The first semiconductor nanocrystal is prepared in the same manner as Example 1, except that the amounts of the indium precursor and sulfur precursor added account for 7 mole equivalents of indium and 11 mole equivalents of sulfur per one mole of silver and the reaction temperature is lowered to 170° C.

A photoluminescence spectroscopy analysis of the obtained semiconductor nanocrystals is conducted, and the results are shown in FIG. 8A and Table 1. An ICP-AES analysis and a TEM analysis are conducted for the obtained semiconductor nanocrystals and the results are shown in Table 2.

Example 3

The first semiconductor nanocrystal is prepared in the same manner as Example 1, except that the amounts of the indium precursor and the sulfur precursor added account for 5 mole equivalents and 8 mole equivalents per one mole of silver.

A photoluminescence spectroscopy analysis of the obtained semiconductor nanocrystals is conducted, and the results are shown in FIG. 8A and Table 1. An ICP-AES analysis and a TEM analysis are conducted for the obtained semiconductor nanocrystals and the results are shown in Table 2.

Comparative Example 1

The first semiconductor nanocrystal is prepared in the same manner as Example 1, except that the amounts of the indium precursor and the sulfur precursor added account for 1.4 mole equivalents of indium and 6.6 mole equivalents of sulfur per one mole of silver.

A photoluminescence spectroscopy analysis is conducted of the obtained semiconductor crystals, and the results are shown in FIG. 8A and Table 1. An ICP-AES analysis and a TEM analysis are conducted for the obtained semiconductor nanocrystals and the results are shown in Table 2.

TABLE 1

| Photoluminescence spectroscopy analysis | | | |
| --- | --- | --- | --- |
| | Band-edge emission wavelength | Defect emission wavelength | FWHM of Defect emission |
| Example 1 | 522 nm | 646 nm | 133 nm |
| Example 2 | 562 nm | 628 nm | 152 nm |
| Example 3 | 508 nm | 616 nm | 115 nm |
| Comp. Example 1 | — | — | — |

TABLE 2

| ICP-AES and TEM Results | | | |
| --- | --- | --- | --- |
| | Mole ratios | | | |
| | Ag:S | In:S | In:Ag | S:Ag |
| Comp. Example 1 | 0.40:1 | 0.52:1 | 1.31:1 | 2.52:1 |
| Example 1 | 0.26:1 | 0.55:1 | 2.11:1 | 3.84:1 |
| Example 2 | 0.21:1 | 0.55:1 | 2.68:1 | 4.86:1 |
| Example 3 | 0.14:1 | 0.58:1 | 4.23:1 | 7.28:1 |

From the results of Table 1 and FIG. 8a, it is confirmed that the semiconductor nanocrystals of Comparative Example 1 do not emit light. In comparison, the semiconductor nanocrystals of Examples 1, 2, and 3 do emit light as indicated in FIG. 8A and exhibit emission peaks with similar intensities. As shown, the semiconductor nanocrystal of the Examples 1, 2, and 3 exhibit band edge emissions and defect emissions, and the defect emission is greater than the higher energy band-edge emission. The full width at half maximum reported in Table refers to the defect emission.

Example 4

Gallium chloride is dissolved in toluene to prepare a 5.68 M gallium precursor containing solution (hereinafter, abbreviated as a gallium precursor).

Dimethyl thiourea (DMTU), oleyl amine, and dodecanethiol are added to a reaction flask and vacuum-treated at 120° C. for 10 minutes. Subsequently, nitrogen is introduced into the reaction flask cooled to room temperature and the reaction flask is heated to 240° C. (a first temperature), the first semiconductor nanocrystal obtained in Example 1 and the gallium precursor are then added to the reaction flask. The reaction flask is heated to 320° C. (a second temperature) and the reaction proceeds at the second temperature for about 30 minutes (a first duration). The reaction flask is cooled to 180° C., and trioctylphosphine is added and the reaction mixture allowed to cool to room temperature. Hexane and ethanol are added to the cooled reaction flask to facilitate precipitation of a semiconductor nanoparticles, which are recovered (separated) via centrifugation and then dispersed in toluene.

A mole ratio of the added gallium precursor to the sulfur precursor is 2.3:1.6.

Figure 9:
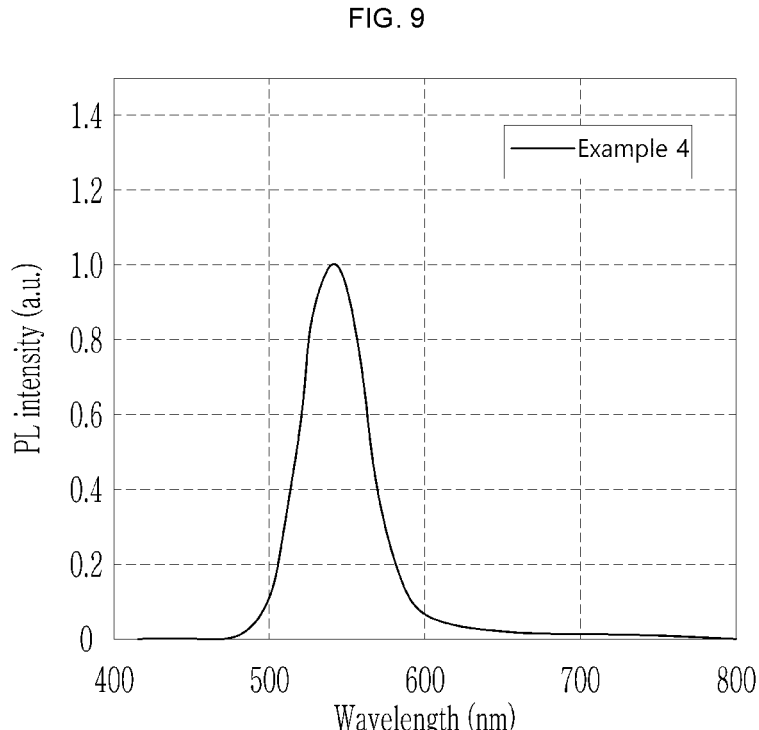
FIG. 9 shows a luminescent spectrum of the semiconductor nanoparticle prepared in Example 4.

A photoluminescence spectroscopy analysis and an UV-Vis absorption spectroscopy are performed with respect to the obtained semiconductor nanocrystals of Example 4, and the results are shown in FIGS. 8B, 9, and Table 3. An ICP-AES analysis and a TEM analysis are conducted for the obtained semiconductor nanocrystals of Example 4 and the results are shown in Tables 4A and 4B. The obtained semiconductor nanocrystals have an average particle size of about 6.3 nm.

TABLE 3

| | Photoluminescence spectroscopy | | |
|---|---|---|---|
| | Band-edge emission wavelength | QY | Full width at half maximum |
| Example 4 | 542 nm | 78% | 50 nm |

TABLE 4A

| | ICP-AES and TEM Results | | | | |
|---|---|---|---|---|---|
| | Ag:S | In:S | Ga:S | In:Ag | Ga:Ag |
| Example 4 | 0.34:1 | 0.12:1 | 0.47:1 | 0.35:1 | 1.37:1 |

TABLE 4B

| | ICP-AES and TEM Results | | | |
|---|---|---|---|---|
| | Ga:(In + Ga) | (In + Ga):Ag | S:(AIG) [a] | Charge balance |
| Example 4 | 0.80:1 | 1.72:1 | 1.075:1 | 1.15 |

[a] S: (AIG) = S:(Ag + In + Ga)

From the results of Table 3, FIG. 8B, and FIG. 9, the semiconductor nanoparticles of Example 4 exhibit relatively improved optical properties, e.g., quantum yield and absorbance. From the results of Table 4, the semiconductor nanoparticles of Example 4 has a mole ratio of silver to a sum of indium and gallium ((In+Ga):Ag) that is greater than or equal to about 1.5:1.

From the results of Table 3, a relative band-edge emission intensity as defined by the following equation is greater than or equal to about 24.8:

$$\text{relative band-edge emission intensity} = A1/A2$$

wherein, A1 is an intensity of the spectrum at an emission peak wavelength, and

A2 is a maximum intensity of the spectrum in a range of the emission peak wavelength plus greater than or equal to 80 nm.

While this disclosure has been described in connection with what is presently considered to be practical embodiments, it is to be understood that the invention is not limited to the disclosed embodiments. On the contrary, it is intended to cover various modifications and equivalent arrangements included within the spirit and scope of the appended claims.

What is claimed is:

1. Semiconductor nanoparticles comprising silver, a Group 13 metal, and a chalcogen element, wherein the Group 13 metal comprises indium and gallium, wherein the chalcogen element comprises sulfur and optionally selenium, wherein the semiconductor nanoparticles are configured to emit a green light, wherein the green light has an emission peak wavelength of greater than or equal to about 500 nanometers and less than or equal to about 580 nanometers, wherein the green light exhibits a full width at half maximum of greater than or equal to about 5 nanometers and less than or equal to about 70 nanometers, wherein the semiconductor nanoparticles are configured to exhibit a quantum yield of greater than or equal to about 50%, wherein the semiconductor nanoparticles comprises:

a mole ratio of a sum of indium and gallium to silver (In+Ga):Ag of greater than or equal to 1.25:1 and less than or equal to 2.6:1;

wherein the semiconductor nanoparticle has a core-shell structure including a core and a shell disposed on the core, and the core includes silver, indium, and sulfur, and does not include gallium, wherein in a photoluminescence spectrum of the semiconductor nanoparticles, a relative band-edge emission intensity as defined by the following equation is greater than 20:

$$\text{relative band-edge emission intensity} = A1/A2$$

wherein, A1 is an intensity of the spectrum at an emission peak wavelength, and

A2 is a maximum intensity of the spectrum in a wavelength range of the emission peak wavelength plus greater than or equal to 80 nanometers.

2. The semiconductor nanoparticles of claim 1, wherein the semiconductor nanoparticles exhibit a quantum yield of greater than or equal to about 60% and less than or equal to 100%.

3. The semiconductor nanoparticles of claim 1, wherein the full width at half maximum is greater than or equal to about 10 nanometers and less than or equal to about 55 nanometers, and a mole ratio of a sum of indium and gallium to silver (In+Ga):Ag is greater than or equal to 1.5:1 and less than or equal to 2.4:1;

a mole ratio of gallium to a sum of indium and gallium Ga: (Ga+In) is greater than or equal to 0.8:1 and less than or equal to 0.99:1; and the mole ratio of indium to silver In:Ag is greater than or equal to 0.1:1 to less than or equal to 0.6:1.

4. The semiconductor nanoparticles of claim 1, wherein the semiconductor nanoparticles exhibit a quantum yield of greater than or equal to about 70% and less than or equal to 99.9%, and wherein the full width at half maximum is greater than or equal to about 15 nanometers and less than or equal to about 53 nanometers.

5. The semiconductor nanoparticles of claim 1, wherein in the core, a mole ratio of indium to silver In:Ag is greater than or equal to about 1.5:1 and less than or equal to about 10:1, and a mole ratio of indium to sulfur In:S is greater than or equal to about 0.1:1 and less than or equal to about 0.8:1.

6. The semiconductor nanoparticles of claim 1, wherein in the semiconductor nanoparticles, a charge balance value defined by the following equation is greater than or equal to about 0.8 and less than or equal to about 1.5:

$$\text{charge balance value} = \{[Ag] + 3([In] + [Ga])\}/2[S]$$

wherein [Ag], [In], [Ga], and [S] are moles of silver, indium, gallium, and sulfur, respectively, in the semiconductor nanoparticle.

7. The semiconductor nanoparticles of claim 1, wherein in the semiconductor nanoparticles, a mole ratio of a sum of indium and gallium to silver (In+Ga):Ag is greater than or equal to about 1.7:1 and less than or equal to about 2.3:1, or a mole ratio of gallium to sulfur Ga:S is greater than or equal to about 0.3:1 and less than or equal to about 1:1, or the mole ratio of indium to silver In:Ag is greater than or equal to 0.1:1 to less than or equal to 0.6:1.

8. The semiconductor nanoparticles of claim 1, wherein an average particle size of the semiconductor nanoparticles is greater than or equal to about 2.6 nanometers and less than or equal to about 10 nanometers.

9. The semiconductor nanoparticles of claim 8, wherein the semiconductor nanoparticles have a core shell structure including a core and a shell disposed on the core, and a size diameter of the core is greater than or equal to about 1.5 nanometers and less than or equal to about 5.5 nanometers, and optionally, a thickness of the shell is greater than or equal to about 0.3 nanometers and less than or equal to about 4.5 nanometers.

10. The semiconductor nanoparticles of claim 1, wherein the semiconductor nanoparticles do not include lithium.

11. A method for producing the semiconductor nanoparticles of claim 1, comprising:

preparing a first semiconductor nanocrystal including indium, silver, and sulfur, heating a reaction medium including a first precursor, and optionally, an organic ligand, in an organic solvent to a first temperature, and adding a second precursor and the first semiconductor nanocrystal to the heated reaction medium including the first precursor; and heating the reaction medium including the first precursor, the second precursor, and the first semiconductor nanocrystal to a second temperature for a first duration to form semiconductor nanoparticles, wherein if the first precursor is a gallium precursor then the second precursor is a sulfur precursor, or if the first precursor is a sulfur precursor then the second precursor is a gallium precursor, wherein in the first semiconductor nanocrystal, a mole ratio of indium to silver In:Ag is greater than or equal to about 1:1 and less than or equal to about 10:1, wherein the first temperature is greater than or equal to about 180° C. and less than or equal to about 280° C., and the second temperature is greater than or equal to about 240° C. and less than or equal to about 380° C.

12. The method of claim 11, wherein the gallium precursor comprises a gallium halide, a gallium acetylacetonate, or both, the organic solvent comprises an aliphatic amine, and the organic ligand is present and comprises a thiol compound, and optionally, wherein the sulfur precursor comprises a thiourea compound.

13. The method of claim 11, wherein in the preparation of the first semiconductor nanocrystal, a mole ratio of an indium precursor to silver is greater than or equal to about 2.4:1 and less than or equal to about 15:1 and a mole ratio of a sulfur precursor to silver is greater than or equal to about 5:1 and less than or equal to about 30:1.

14. A composite comprising a matrix and the semiconductor nanoparticles of claim 1, wherein the semiconductor nanoparticles are dispersed in the matrix.

15. The composite of claim 14, wherein in the composite, an amount of the semiconductor nanoparticles is greater than or equal to about 1 weight percent and less than or equal to about 50 weight percent based on a total weight of the composite; and wherein the composite has a blue light absorbance of greater than or equal to about 70%.

16. A device comprising a color conversion layer including a color conversion region, and optionally, a partition wall that define each color conversion region of the color conversion layer, wherein the color conversion region comprises a first region corresponding to a first pixel, wherein the first region comprises the composite of claim 14.

17. A display device comprising a light source and a color conversion panel that includes the composite of claim 14, wherein the light source is configured to provide the color conversion panel with incident light.

18. The display device of claim 17, wherein the light source comprises an organic light emitting diode, a micro LED, a mini LED, an LED comprising a nanorod, or a combination thereof.

19. An electronic device comprising the semiconductor nanoparticles of claim 1.

20. The semiconductor nanoparticles of claim 1, wherein in the semiconductor nanoparticles the mole ratio of a sum of indium and gallium to silver (In+Ga):Ag is greater than or equal to 1.5:1 and less than or equal to 2.4:1; and wherein in the core, a mole ratio of indium to silver In:Ag is greater than or equal to about 1.5:1 and less than or equal to about 10:1.

\*    \*    \*    \*    \*